US012810035B2

(12) United States Patent
Erdim et al.

(10) Patent No.: US 12,810,035 B2
(45) Date of Patent: Nov. 24, 2026

(54) STRUCTURAL INCONSISTENCY DETECTION USING DISTANCE DATA

(71) Applicant: The Boeing Company, Chicago, IL (US)

(72) Inventors: Huseyin Erdim, Kirkland, WA (US); Alejandro Alberto Ortiz, Seattle, WA (US); Michael Drumheller, Seattle, WA (US); Eric James Walker, Kenmore, WA (US)

(73) Assignee: The Boeing Company, Arlington, VA (US)

( * ) Notice: Subject to any disclaimer, the term of this patent is extended or adjusted under 35 U.S.C. 154(b) by 1148 days.

(21) Appl. No.: 17/553,410

(22) Filed: Dec. 16, 2021

(65) Prior Publication Data

US 2022/0198091 A1 Jun. 23, 2022

Related U.S. Application Data

(60) Provisional application No. 63/126,971, filed on Dec. 17, 2020.

(51) Int. Cl.
*G06F 30/15* (2020.01)
*G01B 17/00* (2006.01)
(Continued)

(52) U.S. Cl.
CPC ........... *G06F 30/15* (2020.01); *G01N 29/043* (2013.01); *G01N 29/0609* (2013.01);
(Continued)

(58) Field of Classification Search
None
See application file for complete search history.

(56) References Cited

U.S. PATENT DOCUMENTS 10,345,272 B2 7/2019 Holmes et al.
10,377,485 B2 8/2019 Claybrough
(Continued)

FOREIGN PATENT DOCUMENTS

JP 2008064385 A 3/2008
JP 2010039977 A 2/2010
(Continued)

OTHER PUBLICATIONS

Robbins, Jeffrey, Rui Filipe Fernandes, and Kevin Keller. Design of a System for Aircraft Fuselage Inspection. 2015. (Year: 2015).*
(Continued)

*Primary Examiner* — Ryan F Pitaro
*Assistant Examiner* — Simeon P Drapeau
(74) *Attorney, Agent, or Firm* — Harrity & Harrity, LLP

(57) ABSTRACT

Methods and systems for computing distance data for a structure. A scan surface that represents an inspection area of the structure is identified. A plurality of sample points on an outer surface identified from a model of the structure and a corresponding plurality of projected points on an inner surface identified from the model of the structure are generated using the scan surface, a first geometric representation of the outer surface, and a second geometric representation of the inner surface. Distance data is computed using the plurality of sample points and the corresponding plurality of projected points. The distance data identifies a distance between a point pair formed by a sample point of the plurality of sample points and a corresponding projected point of the corresponding plurality of projected points.

20 Claims, 16 Drawing Sheets

(51) Int. Cl.

| | |
|---|---|
| ***G01B 17/02*** | (2006.01) |
| ***G01N 29/04*** | (2006.01) |
| ***G01N 29/06*** | (2006.01) |
| *G01N 29/44* | (2006.01) |

(52) U.S. Cl.

CPC ....... *G01N 29/0654* (2013.01); *G01N 29/069* (2013.01); *G01B 17/00* (2013.01); *G01B 17/02* (2013.01); *G01N 29/4472* (2013.01); *G01N 2291/0231* (2013.01); *G01N 2291/2638* (2013.01); *G01N 2291/2694* (2013.01)

(56) References Cited

U.S. PATENT DOCUMENTS

| | | | | |
|---|---|---|---|---|
| 2010/0042243 | A1* | 2/2010 | Burgos Gallego ...... | G06F 30/00 700/98 |
| 2013/0028478 | A1* | 1/2013 | St-Pierre .............. | G01B 11/002 382/106 |
| 2014/0207419 | A1 | 7/2014 | Messinger et al. | |
| 2014/0238136 | A1* | 8/2014 | Ten Grotenhuis ..... | G01N 29/11 73/592 |
| 2014/0336806 | A1* | 11/2014 | Bewlay .................. | G01B 11/24 700/98 |
| 2017/0016862 | A1* | 1/2017 | Holmes .................. | G01N 29/30 |

FOREIGN PATENT DOCUMENTS

| | | | |
|---|---|---|---|
| JP | 2013130392 | A | 7/2013 |
| JP | 2014528083 | A | 10/2014 |
| JP | 2015018446 | A | 1/2015 |
| JP | 2017062226 | A | 3/2017 |
| JP | 2018521406 | A | 8/2018 |
| WO | WO 2013/044350 | A1 | 4/2013 |

OTHER PUBLICATIONS

Pu, Shi, and George Vosselman. "Knowledge based reconstruction of building models from terrestrial laser scanning data." ISPRS Journal of Photogrammetry and Remote Sensing 64, No. 6 (2009): 575-584. (Year: 2009).*

Extended European Search Report dated Mar. 18, 2022 from corresponding European application No. EP 21214302, 7 pages.

* cited by examiner

STRUCTURAL INCONSISTENCY DETECTION USING DISTANCE DATA

CROSS-REFERENCE TO RELATED APPLICATION

This application claims priority to U.S. Provisional Patent Application No. 63/126,971, filed Dec. 17, 2020 and entitled "Structural Inconsistency Detection Using Distance Data," which is incorporated by reference herein in its entirety.

FIELD

This disclosure generally relates to the nondestructive inspection and, more particularly, to detecting structural inconsistencies using nondestructive inspection and design distance data.

BACKGROUND

Nondestructive inspection (NDI) is a testing and analysis technique used to evaluate the properties of a structure without causing damage to the structure.

Nondestructive inspection may be also referred to as nondestructive testing (NDT), nondestructive examination (NDE), and nondestructive evaluation (NDE). Evaluating the data generated via some currently available nondestructive inspection techniques may be challenging with respect to large structures with complex shapes, such as fuselage structures, wing structures, and other types of aircraft structures. For example, an ultrasound device may be used to generate measurements (e.g., distance measurements between different surfaces, thickness measurements, etc.) for a fuselage structure. But currently available methodologies may not provide an accurate and reliable way to analyze these measurements with respect to the design data for the fuselage structure. Manual techniques for comparing such measurements with design data may be more cumbersome and time-consuming than desired.

SUMMARY

In one or more examples, a method is provided for inspecting a structure. A scan surface that represents an inspection area of the structure is identified. A plurality of sample points on an outer surface identified from a model of the structure and a corresponding plurality of projected points on an inner surface identified from the model of the structure are generated using the scan surface, a first geometric representation of the outer surface, and a second geometric representation of the inner surface. Distance data is computed using the plurality of sample points and the corresponding plurality of projected points. Sensor data generated for the inspection area of the structure is analyzed using the distance data to detect a presence of an inconsistency in the structure.

In one or more examples, a system comprises a memory for storing a machine-readable medium comprising machine executable code and a processor coupled to the memory. The processor is configured to execute the machine executable code to cause the processor to implement an analysis tool that is configured to: identify a scan surface that represents an inspection area of a structure; generate a plurality of sample points on an outer surface identified from a model of the structure and a corresponding plurality of projected points on an inner surface identified from the model of the structure using the scan surface, a first geometric representation of the outer surface, and a second geometric representation of the inner surface; and compute distance data using the plurality of sample points and the corresponding plurality of projected points, wherein the distance data identifies a distance between a point pair formed by a sample point of the plurality of sample points and a projected point of the corresponding plurality of projected points.

In one or more examples, a method for computing distance data for an aircraft structure is provided. A scan surface that represents an inspection area of the aircraft structure is identified. An outer surface for the aircraft structure and a set of inner surfaces for the aircraft structure are identified using a model of the aircraft structure. A plurality of sample points on the outer surface and, for each selected inner surface of the set of inner surfaces, a corresponding plurality of projected points on the selected inner surface are generated using the scan surface, a first geometric representation of the outer surface, a second geometric representation of the selected inner surface, and a spatial indexing algorithm. Distance data is computed using the plurality of sample points and the corresponding plurality of projected points generated for each selected inner surface of the set of inner surfaces. The distance data provides as-designed data for use in comparing with sensor data generated for the aircraft structure to detect an inconsistency in the aircraft structure.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the example embodiments are set forth in the appended claims. The example embodiments, however, as well as a preferred mode of use, further objectives and features thereof, will best be understood by reference to the following detailed description of an example embodiment of the present disclosure when read in conjunction with the accompanying drawings.

DETAILED DESCRIPTION

The example embodiments described below provide methods and systems for generating as-designed data for use in conjunction with sensor data to detect the presence of structural inconsistencies. The as-designed data includes as-designed distance data. This as-designed data identifies the distances between various surface layers within a structure that are designed for the structure. As one example, for an aircraft structure, the as-designed data may provide the theoretical distance between an outer mold line and an inner mold line of the aircraft structure at various locations along the aircraft structure.

The example embodiments described herein provide methods and systems for automating the process of computing the as-designed data. These methods and systems provide cost savings and time savings as compared to using manual techniques that are currently available. The as-designed data includes distance data identifying distances for each of a plurality of sample points. In some examples, these distances include thicknesses, such as part thicknesses, material thicknesses, etc.

For example, the distance data may be computed for each of a plurality of inspection areas designated for a structure. An inspection area may be an area, section, or zone of the structure that is designated for inspection in a single pass. Within this inspection area, an inspection device (e.g., a nondestructive inspection device) may follow a pattern comprising a plurality of paths and a plurality of scan locations along each path of the plurality of paths. In one or more examples, the sample points are the theoretical or abstract representation of the scan locations at which nondestructive inspection has been or is to be performed.

Further, the example embodiments described herein provide methods and systems for generating a function that enables these types of as-designed distances to be computed for any location on a structure regardless of the scan pattern used to inspect the structure. This function may be, for example, a continuous function. Thus, the automated process of computing distance data may not need to be repeated for different types of scan patterns or previously unrepresented scan locations.

Figure 1:
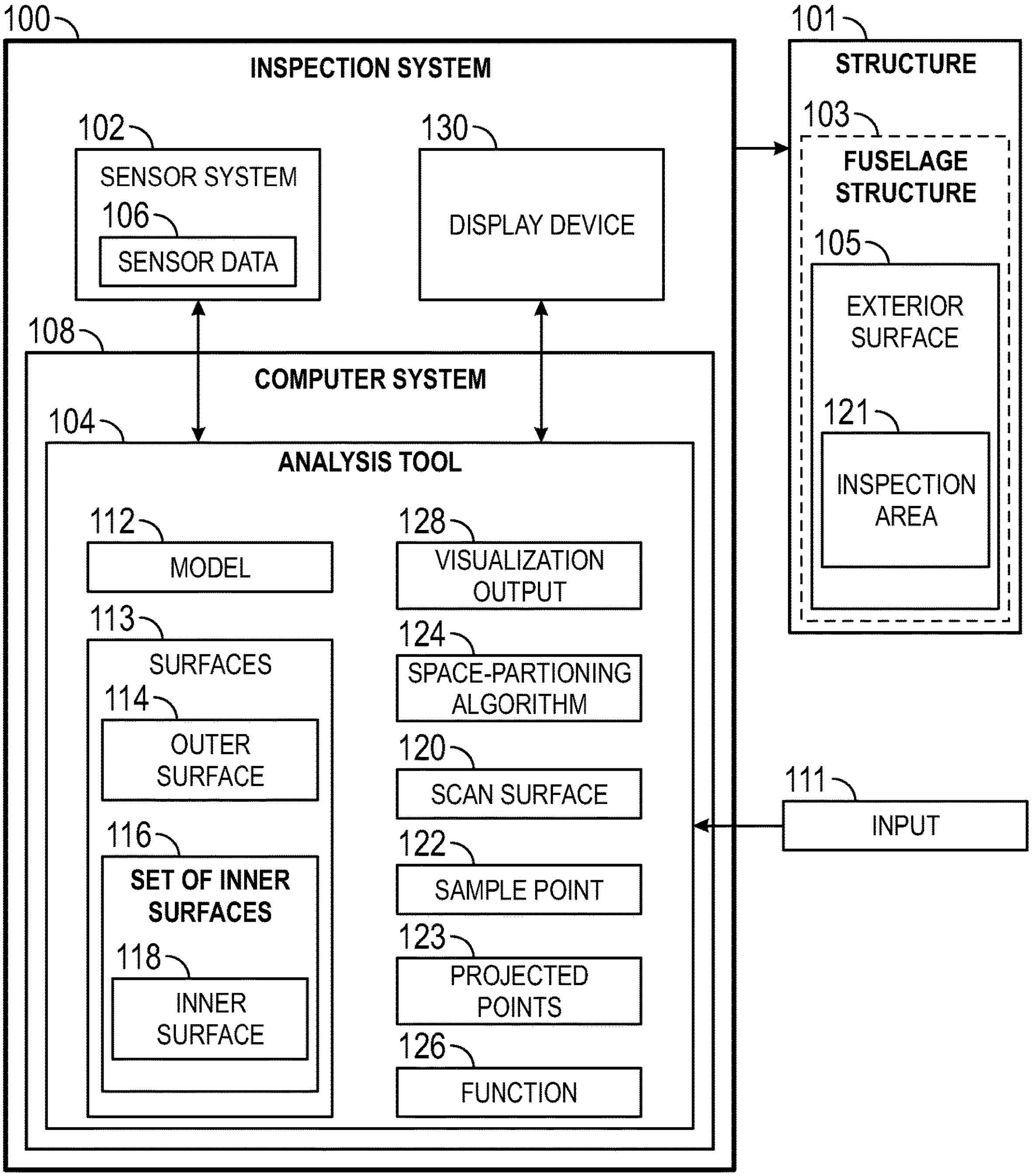
FIG. 1 is a block diagram of an inspection system in accordance with one or more example embodiments.

Referring now to the figures, FIG. 1 is a block diagram of an inspection system in accordance with one or more example embodiments. Inspection system 100 may be used to inspect structure 101. In one or more examples, structure 101 is a composite structure, with inspection system 100 being used to perform nondestructive inspection of the composite structure.

Structure 101 may take any of a number of different forms. In one or more examples, structure 101 takes the form of an aircraft structure. For example, structure 101 may take the form of fuselage structure 103 (e.g., a barrel fuselage structure). Fuselage structure 103 may be an entire fuselage of an aircraft, such as aircraft 1700 described below with respect to FIG. 17, or may be a portion of a fuselage. In other examples, structure 101 takes the form of a wing structure, a tail section, a nose section, a control surface structure (e.g., a flap, a stabilizer, an aileron, etc.). Thus, depending on the implementation, structure 101 may be a part, an assembly, a system, a collection of surfaces, or some other type of structural entity.

In one or more examples, inspection system 100 includes sensor system 102 and analysis tool 104. Sensor system 102 may include one or more sensors that are used to generate sensor data 106. In one or more examples, sensor system 102 includes at least one nondestructive inspection (NDI) device. An NDI device may include one or more sensors for performing nondestructive inspection.

For example, without limitation, an NDI device may include an ultrasonic device (e.g., an ultrasonic transducer) for performing ultrasonic inspection of structure 101. During inspection, the ultrasonic device may be moved (or scanned) over structure 101. The ultrasonic device may be separated from exterior surface 105 of structure 101 by a couplant (e.g., oil) or water.

Sensor system 102 generates sensor data 106 that is used to determine whether structure 101 has any inconsistencies. As used herein, an inconsistency may be an undesired feature or a feature that is outside of the design of or selected tolerances for structure 101. For example, an inconsistency may be a void, a crack, a certain level of porosity, delamination, some other type of inconsistency or a combination thereof. In one or more examples, sensor data 106 includes measurements or data that can be used to calculate distances between different surfaces of structure 101. At least a portion of these distances may identify or may be used to identify thicknesses for different parts of structure 101 or layers of parts.

In one or more examples, analysis tool 104 may be communicatively coupled to sensor system 102. For example, analysis tool 104 may be capable of communicating with sensor system 102 over at least one of a wireless communications link, a wired communications link, an optical communications link, or a combination thereof.

Analysis tool 104 may be implemented using hardware, software, firmware, or a combination thereof. When software is used, the operations performed by analysis tool 104 may be implemented using, for example, without limitation, program code configured to run on a processor unit. When firmware is used, the operations performed by analysis tool 104 may be implemented using, for example, without limitation, program code and data and stored in persistent memory to run on a processor unit.

When hardware is employed, the hardware may include one or more circuits that operate to perform the operations performed by analysis tool 104. Depending on the implementation, the hardware may take the form of a circuit system, an integrated circuit, an application specific integrated circuit (ASIC), a programmable logic device, or some other suitable type of hardware device configured to perform any number of operations.

A programmable logic device may be configured to perform certain operations. The device may be permanently configured to perform these operations or may be reconfigurable. A programmable logic device may take the form of, for example, without limitation, a programmable logic array, a programmable array logic, a field programmable logic array, a field programmable gate array, or some other type of programmable hardware device.

In one or more examples, analysis tool 104 is implemented within computer system 108. Computer system 108 may take the form of any of a number of different types of computing platforms. For example, computer system 108 may include a single computer or multiple computers in communication with each other. In other examples, computer system 108 may take the form of a cloud computing system, a smartphone, a tablet, or some other type of computing platform.

Analysis tool 104 is used to generate distance data 110 that can be used in conjunction with sensor data 106 to detect any inconsistencies in structure 101. In some examples, analysis tool 104 is itself capable of performing an analysis of sensor data 106 using distance data 110 to detect inconsistencies in structure 101. In one or more examples, analysis tool 104 may receive input 111 that is used to generate distance data 110. Input 111 may include user input, input from a program, input from a different computing platform, data retrieved from a database or some other data store, some other type of input, or a combination thereof. Input 111 may identify, for example, user (or customer) requirements.

Distance data 110 comprises data identifying different distances between one or more surface pairs associated with structure 101. A surface pair comprises two surfaces that are aligned (e.g., overlap). For example, distance data 110 may identify the distance between a first location along an outer surface of a fuselage skin and a second location on an inner surface of the fuselage skin. The second location on the inner surface lies along a vector that is substantially normal to the outer surface at the first location. As used herein, "substantially normal" means normal or nearly normal, with selected tolerances. Distance data 110 may include any number of distances for any number of surface pairs.

Distance data 110 is generated based on the design of structure 101. Accordingly, distance data 110 may be referred to as design distance data, design-based distance data, or as-designed distance data. In one or more examples, a distance identified in distance data 110 may be a thickness of a part or portion of structure 101. Thus, in some cases, at least a portion of distance data 110 may include thickness data. This thickness data may be also referred to as design thickness data, design-based thickness data, or as-designed thickness data.

In these examples, analysis tool 104 generates distance data 110 based on model 112 of structure 101. Model 112 may be a data-based representation of structure 101. For example, model 112 may be a computer-aided design (CAD) model of structure 101. In some examples, model 112 comprises data that can be used to construct a three-dimensional model of structure 101. In or more examples, model 112 is received in input 111.

Analysis tool 104 uses model 112 to identify a plurality of surfaces 113 for structure 101. These surfaces 113 are the as-designed surfaces for structure 101. In one or more examples, surfaces 113 includes outer surface 114 and set of inner surfaces 116. Set of inner surfaces 116 includes one or more inner surfaces of structure 101. Each surface of surfaces 113 may be a continuous surface or a discontinuous surface.

When structure 101 takes the form of an aircraft structure such as fuselage structure 103, outer surface 114 may be an outer mold line (OML) of fuselage structure 103, which is the outermost surface of fuselage structure 103. This outer mold line may be formed by, for example, at least the outer surface of the fuselage skin.

In this example, inner surface 118 is one example inner surface in set of inner surfaces 116 for fuselage structure 103. Inner surface 118 may be a surface that is located closer to a center axis of fuselage structure 103 as compared to outer surface 114. For example, fuselage structure 103 may have a barrel shape, a cylindrical shape, a cylinder-type shape, or similar. In some examples, inner surface 118 is the surface of the fuselage skin facing the interior of fuselage structure and forms at least a portion of the inner mold line (IML) of fuselage structure 103. In some examples, inner surface 118 is a surface formed by the filler material used in fuselage structure 103. In other examples, inner surface 118 is a surface formed by the various outer surfaces or the various inner surfaces of stringers of fuselage structure 103.

Analysis tool 104 further identifies scan surface 120. Scan surface 120 is a representation of an area of structure 101 that has been inspected (or "scanned") using sensor system 102 or that is to be inspected using sensor system 102. This area may be referred to as an inspection area of an inspection zone. For example, scan surface 120 may represent inspection area 121 over exterior surface 105 of structure 101.

Analysis tool 104 generates a plurality of sample points 122 and, for each surface of set of inner surfaces 116, a corresponding plurality of projected points 123 using scan surface 120, outer surface 114, set of inner surfaces 116, and spatial indexing algorithm 124. Sample points 122 are located along outer surface 114. As used herein, a "sample point" is a point (e.g., defined with respect to three dimensions) that is projected from scan surface 120 at a vector substantially normal to scan surface 120 and that lies on or is coincident with outer surface 114.

Projected points 123 are located along an inner surface (e.g., inner surface 118) of set of inner surfaces 116. As used herein, a "projected point" on an inner surface is a point (e.g., defined with respect to three dimensions) that is projected from a corresponding one of sample points 122 along a vector that is substantially normal to outer surface 114 and that lies on or is coincident with the inner surface.

Sample points 122 and projected points 123 may be generated using spatial indexing algorithm 124. In one or more examples, spatial indexing algorithm 124 is used to identify a portion of model 112 most relevant to generating sample points 122 and projected points 123. Thus, spatial indexing algorithm 124 may be used to reduce the data that needs to be processed to generate sample points 122 and projected points 123, thereby reducing the overall time and processing resources needed to generate distance data 110.

For example, analysis tool 104 may use spatial indexing algorithm 124 to narrow down a portion of inner surface 118 that is aligned with or overlapped by scan surface 120 such that the entirety of inner surface 118 does not need to be processed in order to generate projected points 123. Spatial indexing algorithm 124 may comprise, for example, but is not limited to, one or more algorithms for building k-dimensional trees. Examples of how sample points 122 and projected points 123 may be generated are described in greater detail below in FIG. 9 and FIG. 10, respectively.

Using sample points 122 and projected points 123, analysis tool 104 computes distance data 110. Distance data 110 includes a distance between each corresponding point pair (sample point-projected point pair) from sample points 122 and projected points 123. Distance data 110 thus provides information based on model 112 of structure 101 that can be used for verifying and/or analyzing sensor data 106 generated by sensor system 102.

For example, sensor data 106 may be compared to distance data 110 to determine whether any actual distances between surfaces of structure 101 are outside of the selected tolerances from the designed distances, as identified by distance data 110. Such differences may signal the detection of one or more inconsistencies in structure 101.

In one or more examples, analysis tool 104 generates function 126 using distance data 110. Function 126 enables identifying the designed distance between surfaces (e.g., a design thickness) to be computed at other points along outer surface 114 beyond sample points 122. For example, function 126 may be a continuous function that enables a distance between outer surface 114 and inner surface 118 to be generated for any point along outer surface 114, including those points not included in sample points 122.

In some cases, function 126 may be output from analysis tool 104 to another computing platform (e.g., a cloud computing platform, another computer system, etc.) to enable one or more different users to use function 126 to compute designed distances. Depending on its implementation, function 126 may be alternatively referred to as a distance function or a thickness function.

Although distance data 110 has been described as being generated for a single scan surface 120, distance data 110 may include data generated for multiple scan surfaces. For example, model 112 may be divided into various inspection areas (or inspection zones). Distance data 110 may include data generated for each of these various inspection areas such that data is generated for the entire structure 101.

In some examples, analysis tool 104 generates visualization output 128 of distance data 110. Visualization output 128 may be sent to, for example, display device 130 for display to a user. Visualization output 128 may take different forms. In one or more examples, visualization output 128 takes the form of a three-dimensional distance map or distance model that visually presents at least a portion of distance data 110. In one or more examples, visualization output 128 is a thickness map or thickness model that visually presents thicknesses.

The block diagram of FIG. 1 is not meant to imply physical or architectural limitations to the manner in which an example embodiment may be implemented. Other components in addition to or in place of the ones illustrated may be used. Some components may be optional. Further, the blocks are presented to illustrate functional components. One or more of these blocks may be combined, divided, or combined and divided into different blocks when implemented in an example embodiment.

FIGS. 2-6 are illustrations that describe different steps that may be involved in the generation of distance data, such as distance data 110 in FIG. 1. FIGS. 2-6 are thus described with continuing reference to FIG. 1.

Figure 2:
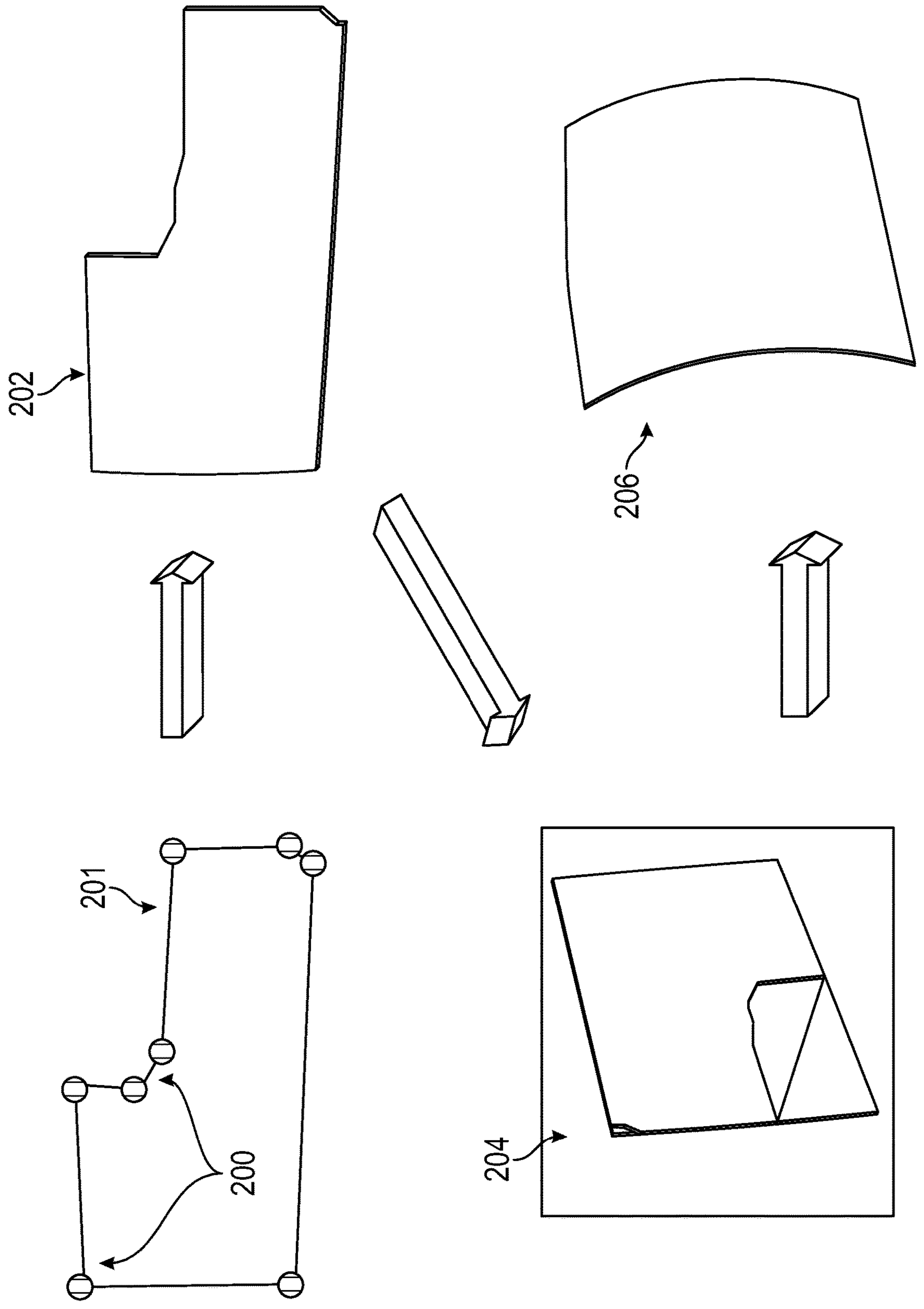
FIG. 2 is a schematic diagram of a process for generating a scan surface in accordance with one or more example embodiments.

FIG. 2 is a schematic diagram of a process for generating a scan surface in accordance with one or more example embodiments. In particular, the process illustrated in FIG. 2 may be implemented by analysis tool 104 in FIG. 1.

Coordinates 200 are first identified. Coordinates 200 may define an area of structure 101 that has been or is to be inspected or "scanned" using sensor system 102 in FIG. 1. For example, coordinate 200 may define inspection area 121 of structure 101 in FIG. 1. Coordinates 200 are on a reference coordinate system. This reference coordinate system may be, for example, the coordinate system of model 112 of structure 101 in FIG. 1.

In one or more examples, coordinates 200 are identified from input 111 in FIG. 1. For example, input 111 may include coordinates 200 extracted from or a program that is used to control sensor system 102 and move sensor system 102 along structure 101. In some cases, input 111 may include the program itself and analysis tool 104 may identify coordinates 200 from the program.

In other examples, input 111 includes user input that identifies coordinates 200. In some cases, input 111 includes data received from sensor system 102 that identifies coordinates 200. In yet other examples, analysis tool 104 may receive input 111 that includes initial coordinates corresponding to a different coordinate system. Analysis tool 104 processes these initial coordinates (e.g., transforms the initial coordinates) to generate coordinates 200 on the reference coordinate system.

Coordinates 200 are processed to identify initial surface 202, which represents inspection area 121 in FIG. 1. In particular, coordinates 200 are used to identify boundary 201 for use in defining initial surface 202. Initial surface 202 may be represented in the three-dimensional domain.

In some cases, when processed with respect to the two-dimensional domain, one or more portions of boundary 201 for initial surface 202 may be formed by one or more convex curves, concave curves, or both. To reduce the processing time associated with initial surface 202 having this type of boundary 201, convex shape 204 may be generated for initial surface 202 in the two-dimensional domain. Convex shape 204 includes one or more local convex hulls that ensure that initial surface 202 is fully or generally contained within convex shape 204. In this manner, convex shape 204 may be convex or nearly convex. In one or more examples, convex shape 204 is generated such that boundary 201 for initial surface 202 is entirely overlapped with or contained within convex shape 204.

Scan surface 206 is then generated in the three-dimensional domain based on convex shape 204. Scan surface 206 is one example of an implementation for scan surface 120 in FIG. 1. Scan surface 206 has a substantially convex shape or boundary. As used herein, "substantially convex" means convex or nearly convex. In one or more examples, scan surface 206 represents the global convex or nearly convex shape for inspection area 121. In these examples, scan surface 206 corresponds to the same reference coordinate system as initial surface 202.

In other cases, boundary 201 of initial surface 202 may itself be substantially convex. Accordingly, initial surface 202 may be used as scan surface 206. In some examples, initial surface 202 is used as scan surface 206 when the shape of boundary 201 is sufficiently simple so as to not increase the amount of processing time or resources needed more than desired.

Figure 3:
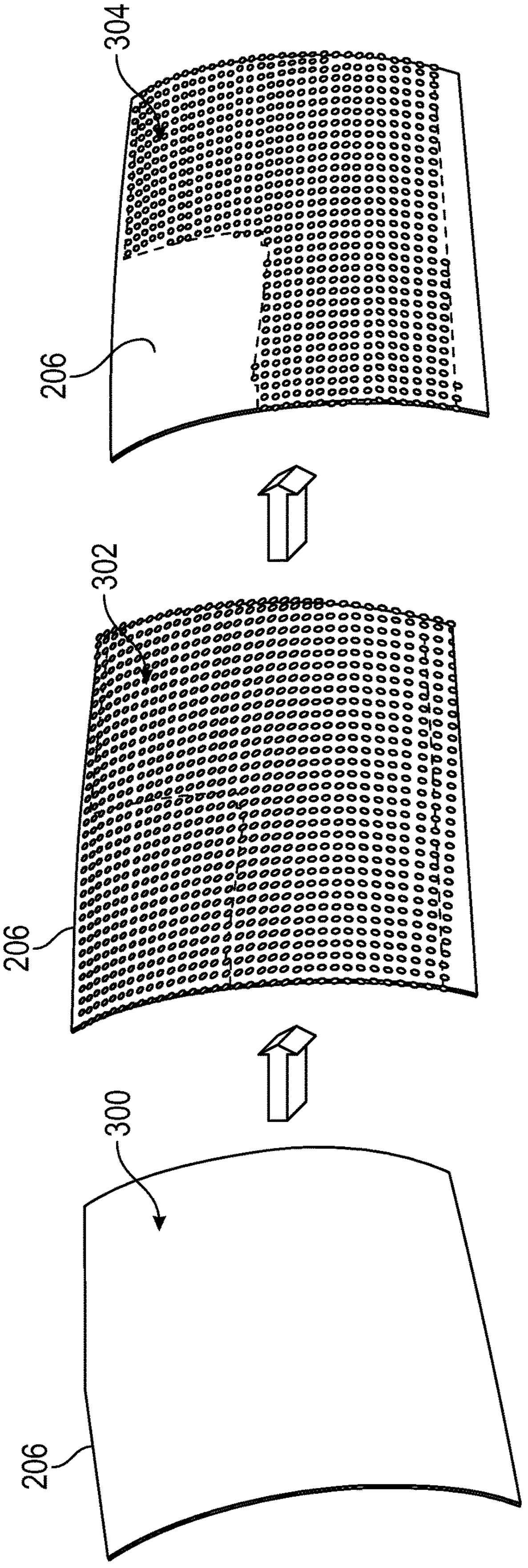
FIG. 3 is schematic diagram of a process for generating a plurality of sample points on the scan surface from FIG. 2 in accordance with one or more example embodiments.

FIG. 3 is schematic diagram of a process for generating a plurality of sample points on scan surface 206 from FIG. 2 in accordance with one or more example embodiments. In particular, the process illustrated in FIG. 3 may be implemented by analysis tool 104 in FIG. 1.

First, a plurality of reference curves 300 are identified along scan surface 206. Each of reference curves 300 represents a path along which sensor system 102 is moved within inspection area 121 in FIG. 1 to inspect or "scan" structure 101. In one or more examples, reference curves

300 are generated based on the same portion of input 111 from which coordinates 200 in FIG. 2 are identified. In other examples, reference curves 300 are generated based on another portion of input 111 received at analysis tool 104.

Reference curves 300 may be equally spaced apart. For example, input 111 may identify a first reference curve (e.g., a spine curve). Analysis tool 104 uses this first reference curve to generate additional reference curves that are parallel to this first reference curve and equally spaced apart with respect to each other. In other examples, not all of reference curves 300 may be equally spaced.

A collection of points 302 along scan surface 206 are then identified using reference curves 300 and a spacing distance. Each of points 302 may be defined in three dimensions (e.g., an x-y-z point). Points 302 may be spaced apart along each of reference curves 300 according to the spacing distance. This spacing distance may be provided by input 111. In some examples, this spacing distance is provided by the same portion of input 111 from which coordinates 200 in FIG. 2, reference curves 300, or both are generated. In other examples, the spacing distance is provided by another portion of input 111.

A plurality of scan points 304 are selected from points 302 based on initial surface 202, boundary 201, or both in FIG. 2. Scan points 304 are those ones of points 302 that are fully contained within boundary 201 or that overlap with initial surface 202 if initial surface 202 were to be superimposed or overlaid over scan surface 206. Scan points 304 may be projected onto an outer surface, such as outer surface 114 in FIG. 1, to generate sample points 122 in FIG. 1.

Figure 4:
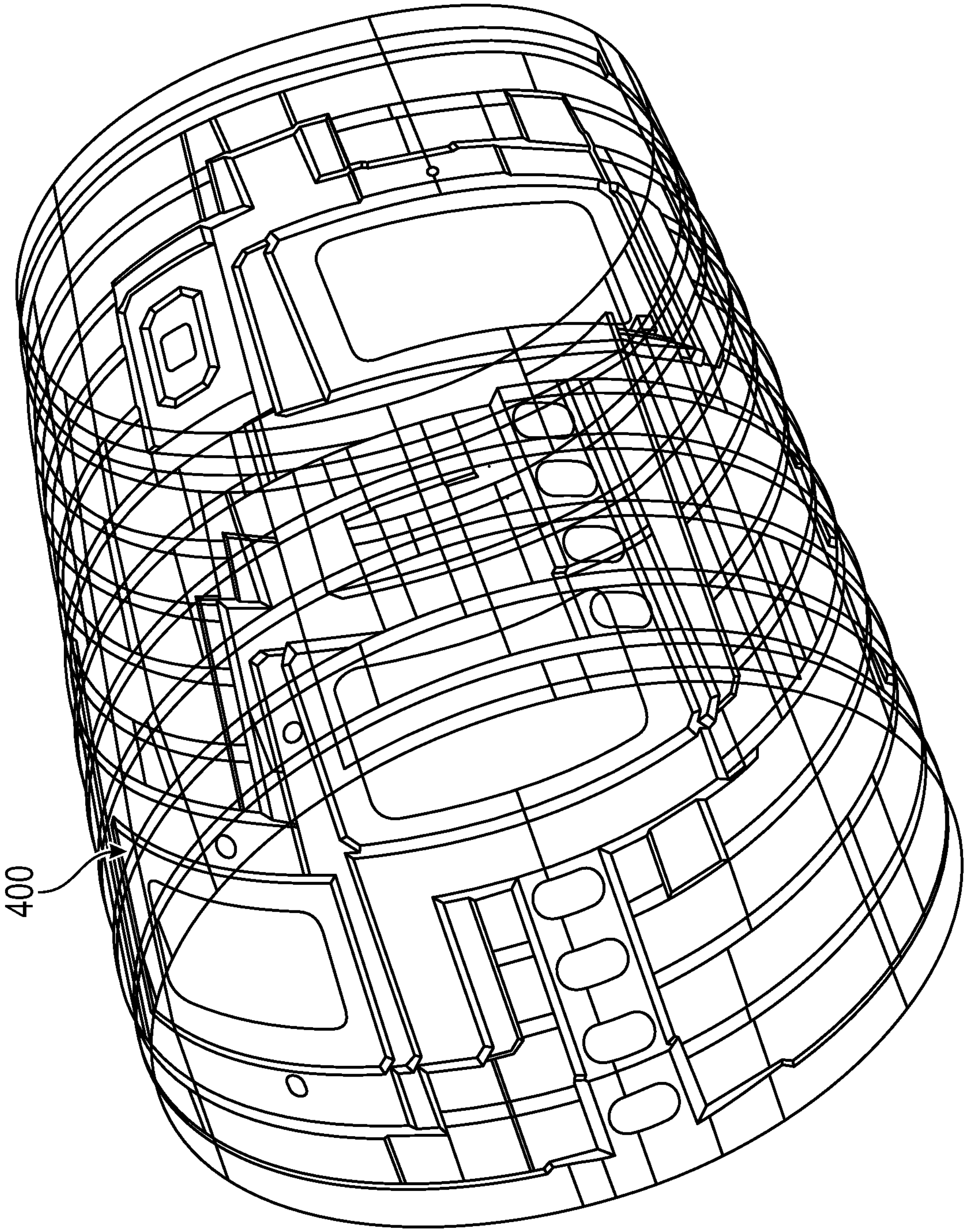
FIG. 4 is a schematic diagram of a geometric representation that has been generated using the model of the structure from FIG. 1 in accordance with one or more example embodiments.

FIG. 4 is a schematic diagram of a geometric representation that has been generated using model 112 of structure 101 in FIG. 1 in accordance with one or more example embodiments. Geometric representation 400 may be generated for one of surfaces 133 identified from model 112 in FIG. 1. In the illustrated example, geometric representation 400 is generated for outer surface 114 in FIG. 1.

Geometric representation 400 comprises a plurality of patches 402. As used herein, a "patch" is a geometric representation of a portion of or a section of a corresponding surface. In some cases, a patch may also be referred to as a surface path. This abstract geometric representation may have a curved shape, a polygonal shape, an irregular shape, or some other type of shape. In one or more examples, patches 402 may have the same shape and size (e.g., the same polygonal shape to form a polygonal mesh) or may have different shapes, different sizes, or both. A patch may be alternatively referred to as a "face," a "surface section." In some examples, geometric representation 400 is referred to as a patched or patch-based representation.

Analysis tool 104 in FIG. 1 may sample patches 402 to identify at least one patch point in each of patches 402. This sampling may be performed in order to build at least one k-dimensional tree that organizes these patch points in the three-dimensional domain.

Figure 5:
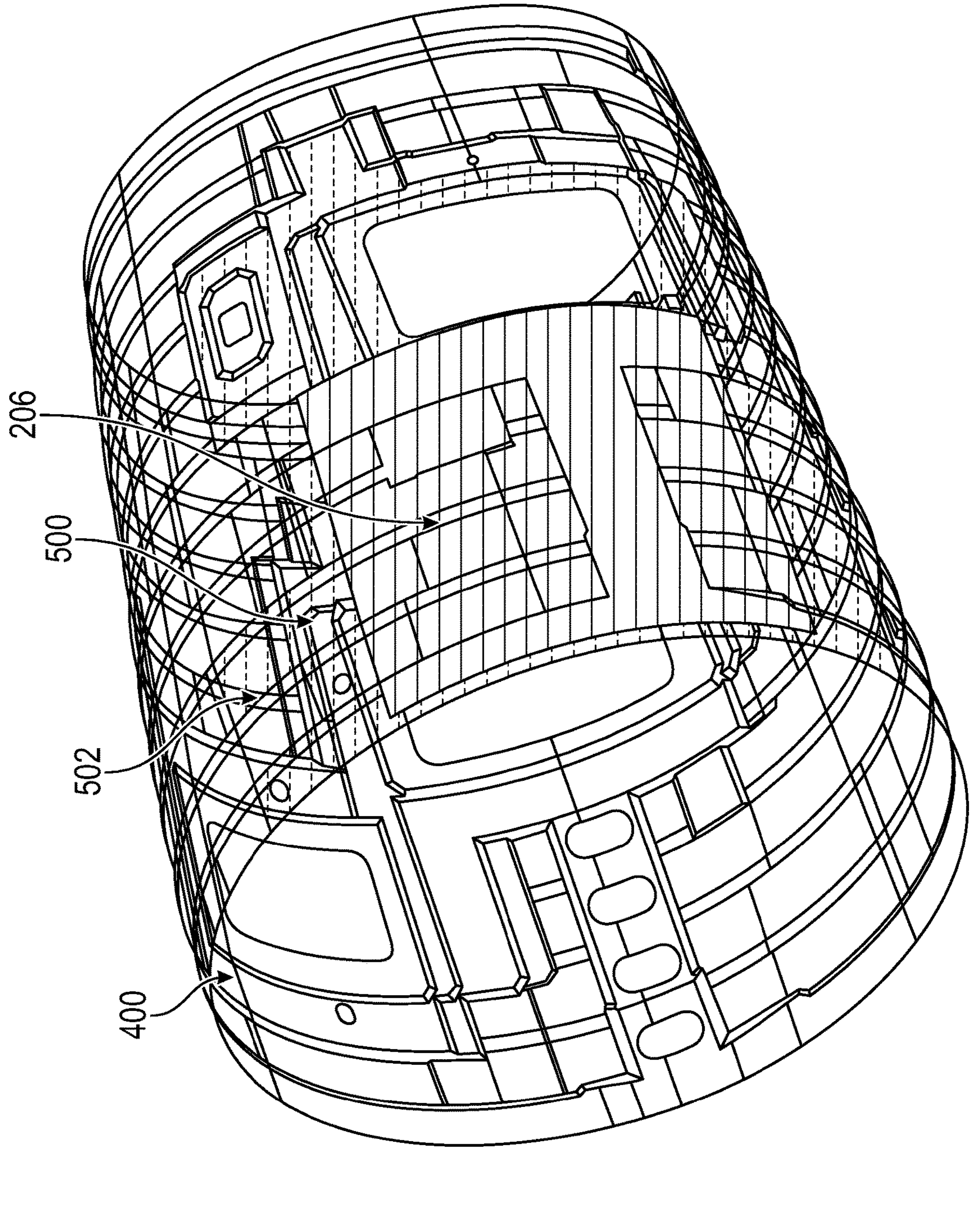
FIG. 5 is a schematic diagram of a relevant surface area that has been identified from the geometric representation in FIG. 4 in accordance with one or more example embodiments.

FIG. 5 is a schematic diagram of a relevant surface area that has been identified from geometric representation 400 in FIG. 4 in accordance with one or more example embodiments. Relevant surface area 500 includes selected portion 502 of patches 402 from FIG. 4 that have been determined to overlap with, coincide with, and/or be in close proximity to scan surface 206 if scan surface 206 were aligned with or superimposed over geometric representation 400 in FIG. 4. Thus, relevant surface 500 corresponds to the surface (e.g., outer surface 114) from which geometric representation 400 is created by representing the portion of that surface most relevant scan surface 206.

The one or more k-dimensional trees generated for geometric representation 400 are used to narrow down patches 402 and identify relevant surface area 500. Relevant surface area 500 provides a more focused space from which to identify sample points 122 in FIG. 1. Using relevant surface area 500 to generate sample points 122 may reduce the overall amount of processing time needed and the amount of processing resources used to generate distance data 110. Although relevant surface area 500 has been described as being generated using k-dimensional trees, in other examples, some other type of technique for accelerating the process of identifying relevant surface area 500 may be used.

Although geometric representation 400 in FIG. 4 and relevant surface area 500 are described with respect to outer surface 114 in FIG. 1, similar steps may be performed for each inner surface of set of inner surfaces 116 in FIG. 1. For example, similar steps may be used to generate projected points 123 in FIG. 1.

Figure 6:
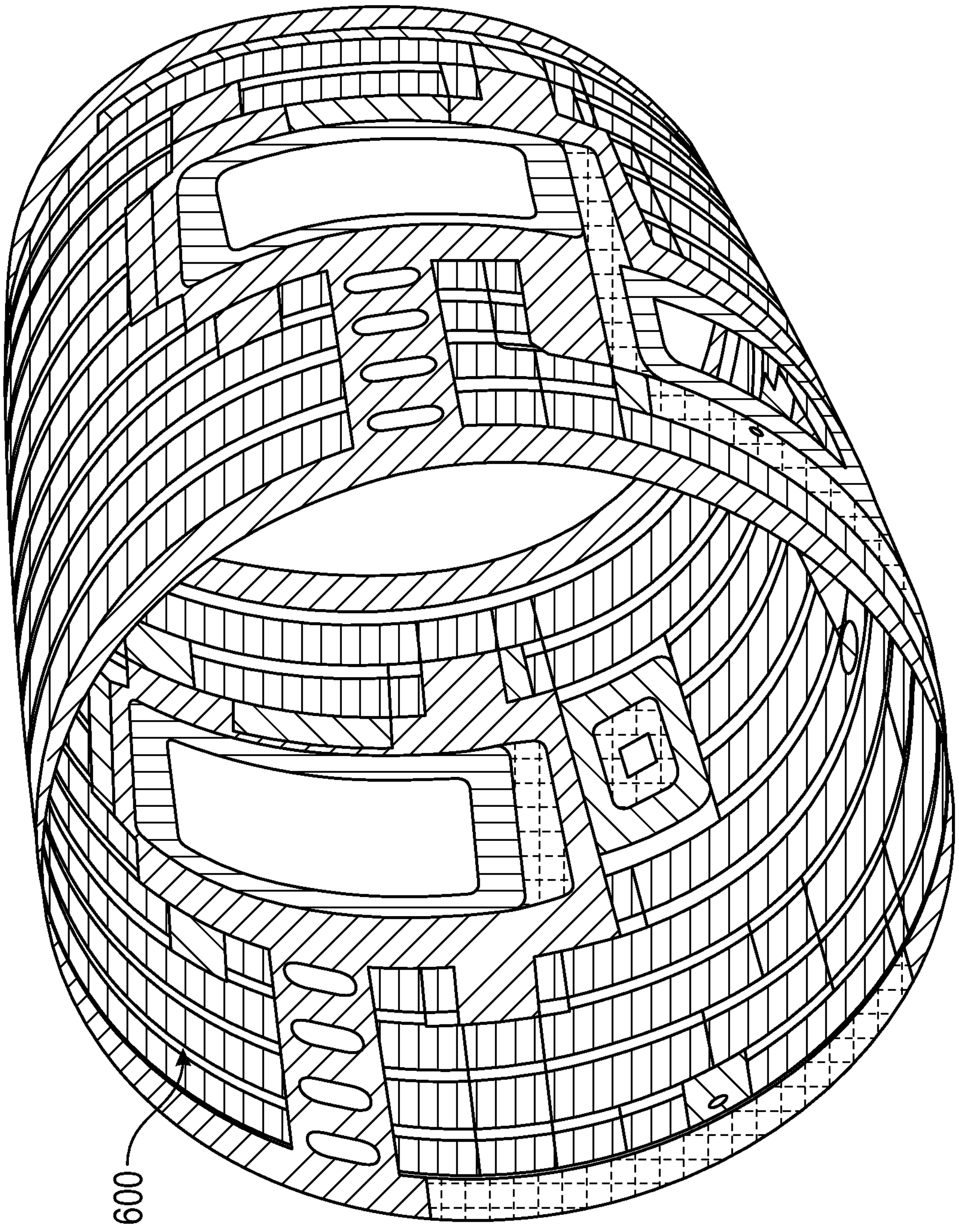
FIG. 6 is an illustration of a thickness map in accordance with one or more example embodiments.

FIG. 6 is an illustration of a thickness map in accordance with one or more example embodiments. Thickness map 600 is one example of an implementation for visualization output 128 in FIG. 1. Thickness map 600 is a three-dimensional mapping of distance data 110 computed for fuselage structure 103 in FIG. 1. In one or more examples, thickness map 600 is color-coded to provide a visualization of different ranges of thicknesses for fuselage structure 103.

In other examples, thickness map 600 may provide a different type of visual indication of the different ranges of thicknesses for fuselage structure 103. For example, different shades of a single color may be used. As another example, different patterns may be used.

Figure 7:
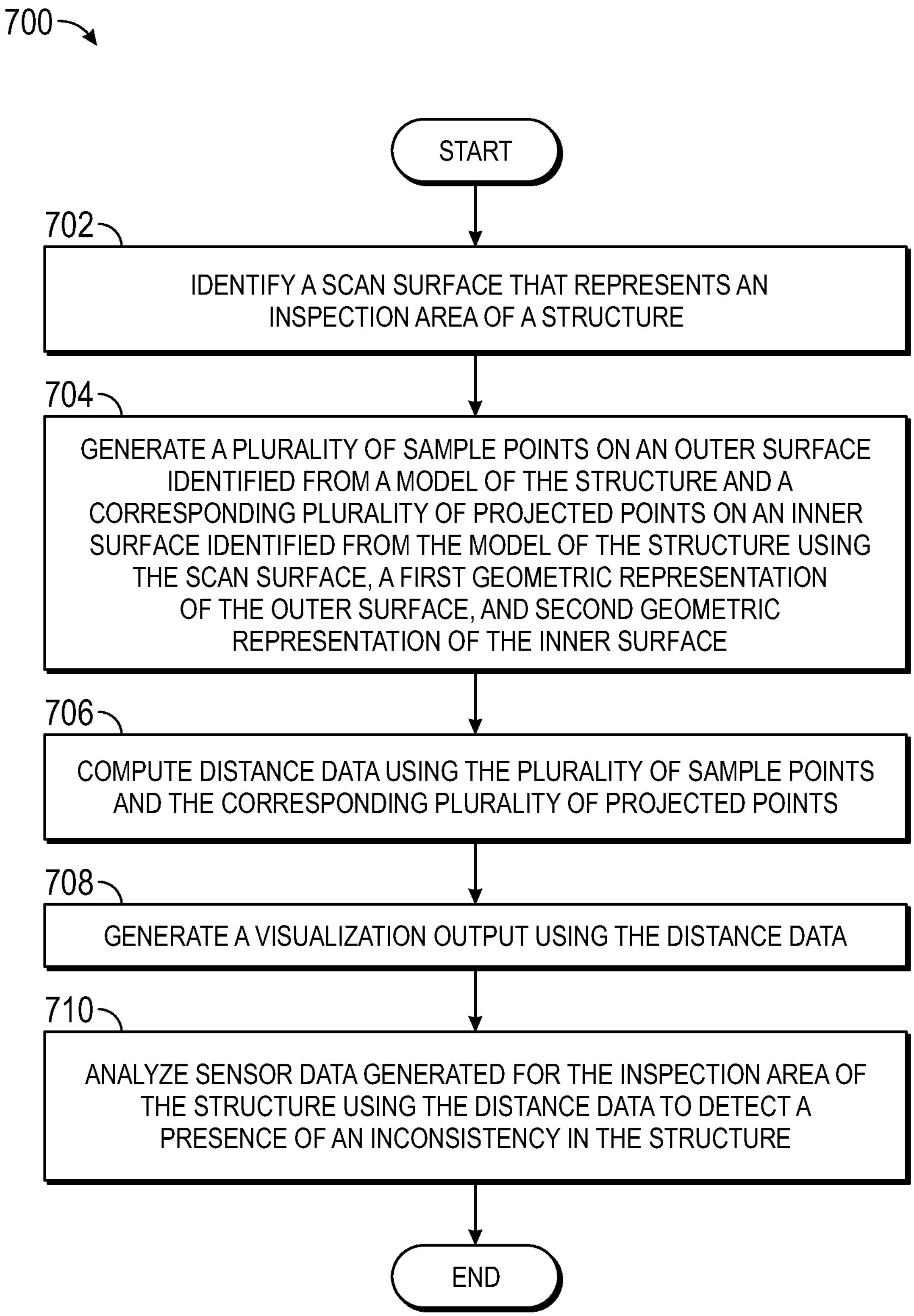
FIG. 7 is a flowchart of a process for inspecting a structure in accordance with one or more example embodiments.

FIG. 7 is a flowchart of a process for inspecting a structure in accordance with one or more example embodiments. Process 700 in FIG. 7 may be implemented using analysis tool 104 in FIG. 1.

Process 700 begins by identifying a scan surface that represents an inspection area of a structure (operation 702). The structure may be, for example, structure 101 in FIG. 1. In one or more examples, the structure takes the form of fuselage structure 103 in FIG. 1. In other examples, the structure may be another type of aircraft structure (e.g., a wing structure, a tail section, a nose section, a control surface structure, etc.). The inspection area of the structure may be, for example, inspection area 121 in FIG. 1. The scan surface may be, for example, scan surface 120 in FIG. 1. In one or more examples, the scan surface may have a substantially convex shape.

A plurality of sample points on an outer surface identified from a model of the structure and a corresponding plurality of projected points on an inner surface identified from the model of the structure are generated using the scan surface, a first geometric representation of the outer surface, a second geometric representation of the inner surface, and a spatial indexing algorithm (operation 704). The plurality of sample points and the corresponding plurality of projected points may be, for example, sample points 122 and projected points 123 in FIG. 1, respectively.

Distance data is computed using the plurality of sample points and the corresponding plurality of projected points (operation 706). The distance data may be, for example, distance data 110 in FIG. 1. Optionally, process 700 may further include generating a visualization output using the distance data (operation 708). This visualization output, which may be visualization output 128 in FIG. 1, may take a number of different forms. For example, the visualization output may include one or more two-dimensional distance maps, one or more three-dimensional distance maps, or a combination thereof.

Sensor data generated for the inspection area of the structure is analyzed using the distance data to detect a presence of an inconsistency in the structure (operation 710), with the process terminating thereafter. The sensor data may be, for example, sensor data 106 in FIG. 1. In one or more examples, the distance data includes a distance between each corresponding point pair from the plurality of sample points and the corresponding plurality of projected points. In other words, the distance data includes a distance for each corresponding sample point-projected point pair.

Figure 8:
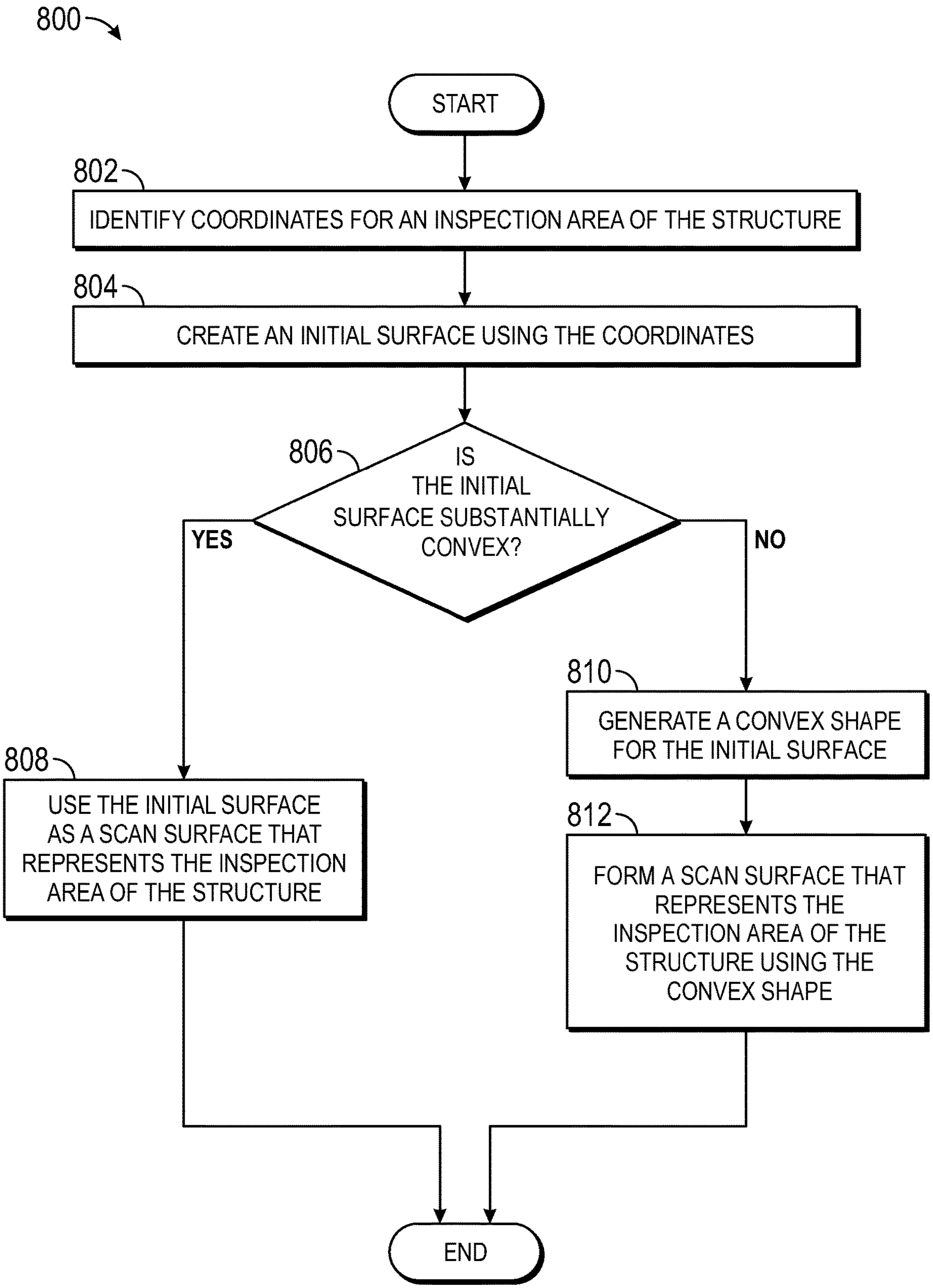
FIG. 8 is a flowchart of a process for identifying a scan surface in accordance with one or more example embodiments.

FIG. 8 is a flowchart of a process for identifying a scan surface in accordance with one or more example embodiments. Process 800 in FIG. 8 may be implemented using analysis tool 104 in FIG. 1. Further, process 800 may be one example of a manner in which operation 702 in FIG. 7 may be implemented.

Process 800 begins by identifying coordinates for an inspection area of the structure (operation 802). Coordinates 200 in FIG. 2 may be one example of an implementation for the coordinates identified in operation 802. The coordinates may be received in user input, identified from a program, or identified in some other manner.

Thereafter, an initial surface is created using the coordinates (operation 804). The initial surface is three-dimensional. Initial surface 202 in FIG. 2 is one example of an implementation for the initial surface created in operation 804.

A determination is made as to whether the initial surface is substantially convex (operation 806). If the initial surface is substantially convex (i.e., substantially contained within a convex shape), the initial surface is used as a scan surface that represents the inspection area of the structure (operation 808), with the process terminating thereafter.

Otherwise, a convex shape is generated for the initial surface (operation 810). The convex shape includes one or more local convex hulls that ensure that the initial surface 202 is fully contained within the convex shape. This convex shape is substantially convex. In one or more examples, the convex shape is generated in the two-dimensional domain. Convex shape 204 in FIG. 2 is one example of an implementation for the convex shape generated in operation 810.

A scan surface that represents the inspection area of the structure is formed using the convex shape (operation 812). In one or more examples, operation 812 may include transforming the convex shape from the two-dimensional domain into the three-dimensional domain to form the scan surface. Scan surface 206 in FIG. 2 is one example of an implementation for the scan surface generated in operation 812.

Figure 9:
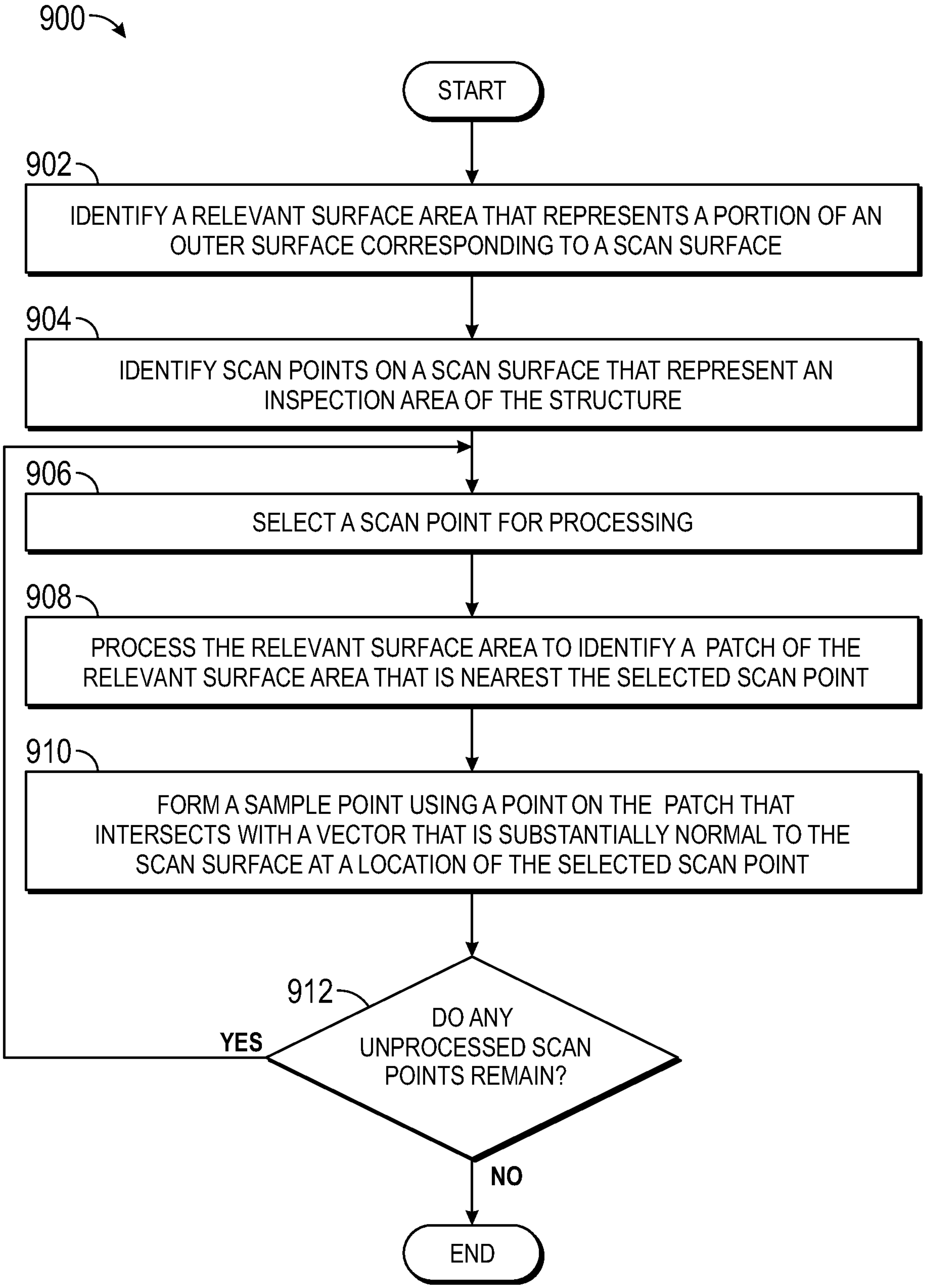
FIG. 9 is a flowchart of a process for generating sample points in accordance with one or more example embodiments.

FIG. 9 is a flowchart of a process for generating sample points in accordance with one or more example embodiments. Process 900 in FIG. 9 may be implemented using analysis tool 104 in FIG. 1. Further, process 900 may be one example of a manner in which at least a portion of operation 704 in FIG. 7 may be implemented.

Process 900 may begin by identifying a relevant surface area that represents a portion of an outer surface that corresponds to a scan surface (operation 902). Relevant surface area 500 in FIG. 5 is one example of an implementation for the relevant surface area identified in operation 902. When the structure is a fuselage structure, the outer surface may be an outer mold line of the fuselage structure. The outer surface may be identified from a model of the structure.

Scan points are identified on a scan surface that represents an inspection area of the structure (operation 904). The scan surface may be, for example, scan surface 120 in FIG. 1. The scan surface may be generated using, for example, process 800 in FIG. 8.

A scan point is selected for processing (operation 906). The relevant surface area is processed to identify a patch of the relevant surface area that is nearest the selected scan point (operation 908). Operation 908 may be performed using, for example, one or more k-dimensional trees built for the relevant surface area, built for the inner surface, or both.

A sample point is formed using a point on the patch that intersects with a vector that is substantially normal to the scan surface at a location of the selected scan point (operation 910). In one or more examples, operation 910 may be performed by identifying the point on the patch that has a minimum distance to the selected scan point as the sample point. In some cases, this sample point is selected from a collection of sampling of points generated for the patch.

A determination is made as to whether any unprocessed scan points remain (operation 912). If any unprocessed scan points remain, process 900 returns to operation 906 described above. Otherwise, the process terminates.

Figure 10:
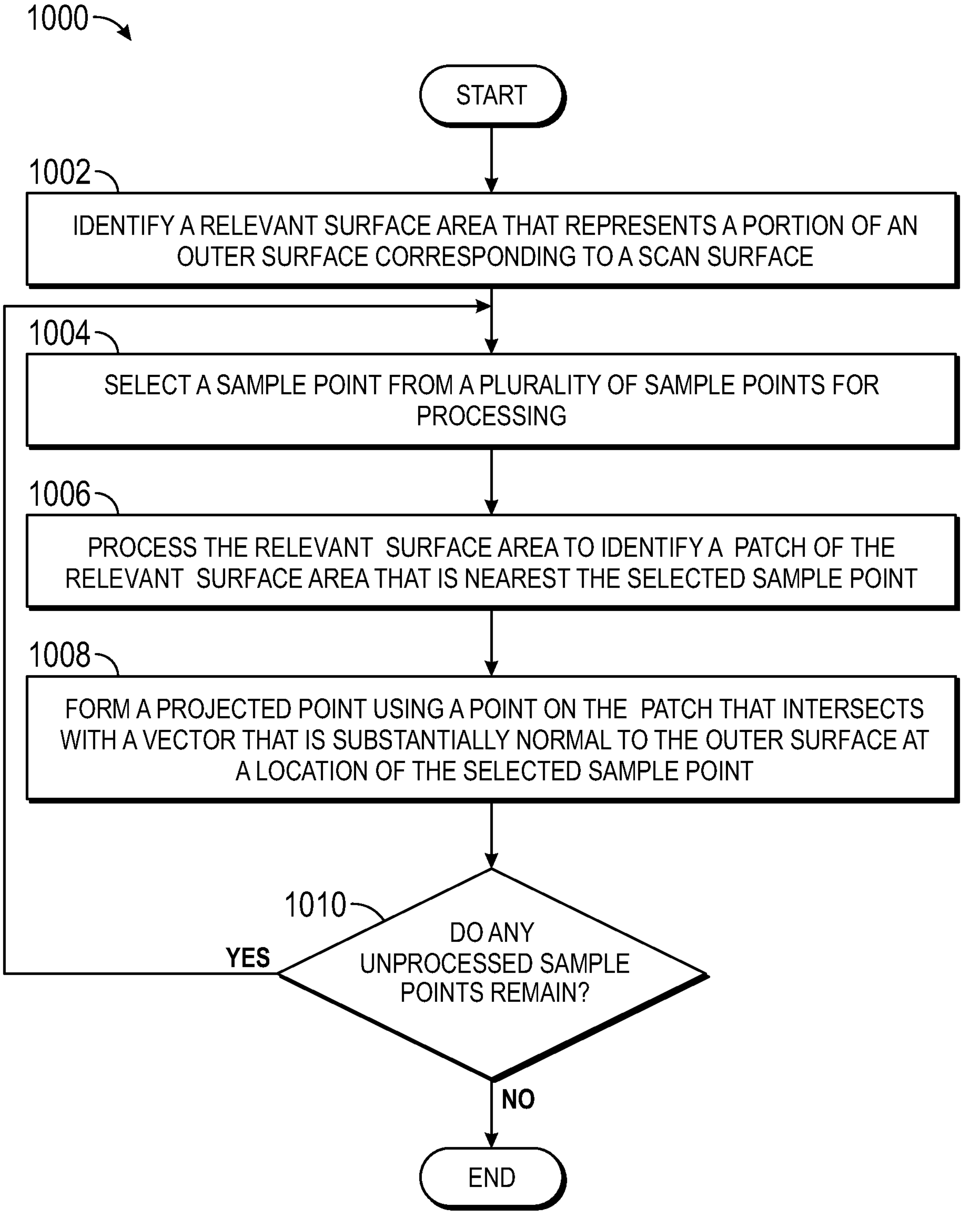
FIG. 10 is a flowchart of a process for generating projected points in accordance with one or more example embodiments.

FIG. 10 is a flowchart of a process for generating projected points in accordance with one or more example embodiments. Process 1000 in FIG. 10 may be implemented using analysis tool 104 in FIG. 1. Further, process 1000 may be one example of a manner in which at least a portion of operation 704 in FIG. 7 may be implemented.

Process 1000 may begin by begin by identifying a relevant surface area that represents a portion of an inner surface that corresponds to a scan surface (operation 1002). This relevant area may be implemented in a manner similar to relevant surface area 500 in FIG. 5. The inner surface in operation 1002 may be, for example, inner surface 118 in FIG. 1. The inner surface may be identified from a model of a structure.

A sample point is selected for processing from a plurality of sample points (operation 1004). The plurality of sample points may be, for example, the sample points generated by process 900 described above.

The relevant surface area is processed to identify a patch of the relevant surface area that is nearest the selected sample point (operation 1006). A projected point is formed using a point on the patch that intersects with a vector that is substantially normal to the outer surface at a location of the selected sample point (operation 1008). In one or more examples, operation 1008 may be performed by identifying the point within the patch corresponding to the inner surface that has a minimum distance to the sample point as the projected point. In some cases, this projected point is selected from a collection of sampling points generated for the patch.

A determination is made as to whether any unprocessed sample points remain (operation 1010). If any unprocessed sample points remain, process 1000 returns to operation 1004 described above. Otherwise, the process terminates.

Figure 11:
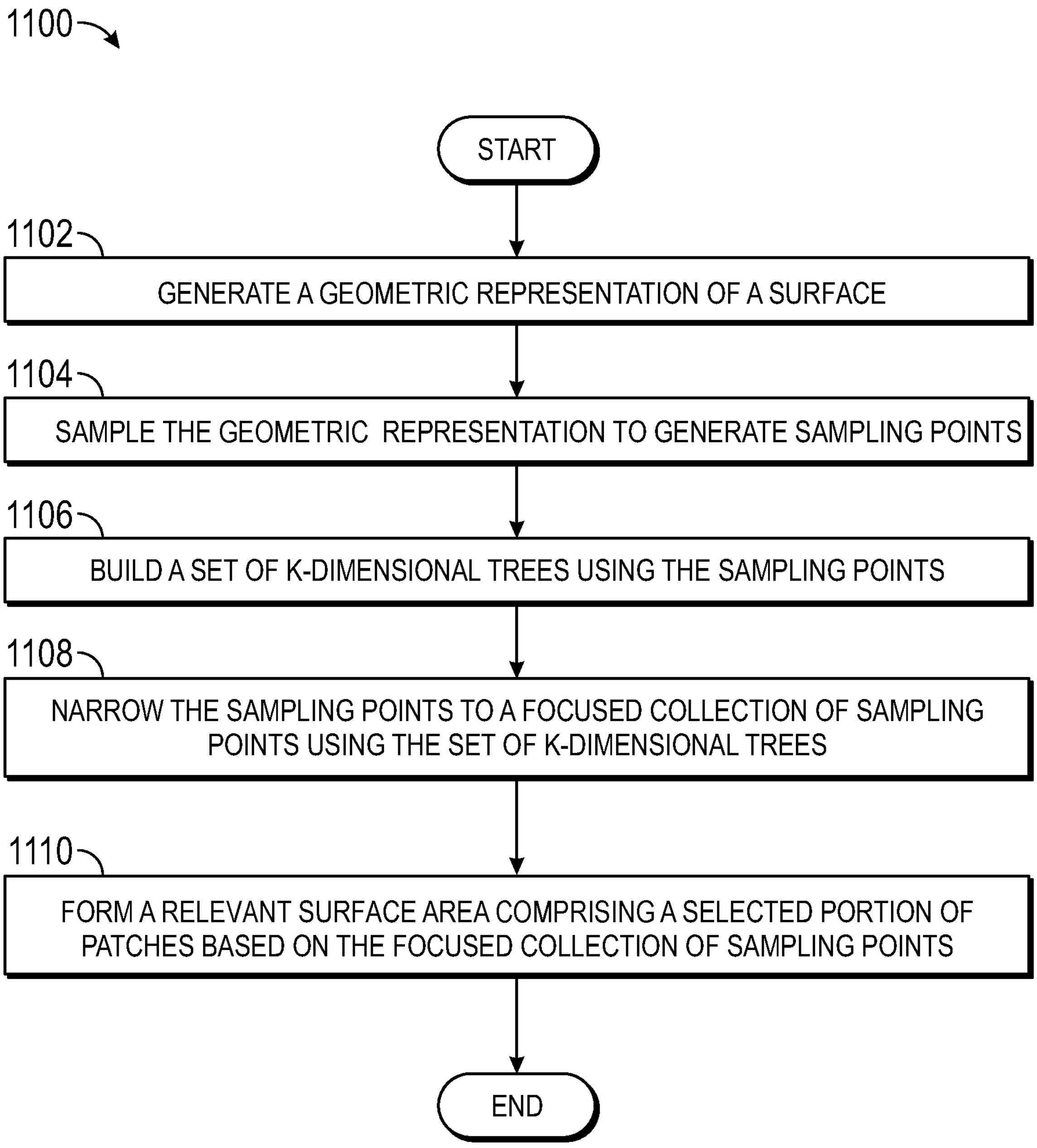
FIG. 11 is a flowchart of a process for identifying a relevant surface area for a surface in accordance with one or more example embodiments.

FIG. 11 is a flowchart of a process for identifying a relevant surface area for a surface in accordance with one or more example embodiments. Process 1100 in FIG. 11 may be implemented using analysis tool 104 in FIG. 1. Further, process 1100 may be one example of a manner in which operation 902 in FIG. 9 and operation 1002 in FIG. 10 may be implemented.

Process 1100 may begin by generating a geometric representation of a surface (operation 1102). The geometric representation comprises a plurality of patches, each of these patches being an abstract geometric representation of a portion of the surface. Geometric representation 400 in FIG. 4 may be one example of an implementation for the geometric representation in operation 1102.

Thereafter, the geometric representation is sampled to generate sampling points (operation 1104). A set of k-dimensional trees is built using the sampling points (operation 1106). The sampling points are narrowed to a focused collection of sampling points using the set of k-dimensional trees (operation 1108). A relevant surface area comprising a selected portion of patches is formed based on the focused collection of sampling points (operation 1110), with the process terminating thereafter. Although process 1100 is described using k-dimensional trees, in other examples, another type of spatial indexing algorithm may be used to perform operations 1106 and 1108 described above.

Figure 12:
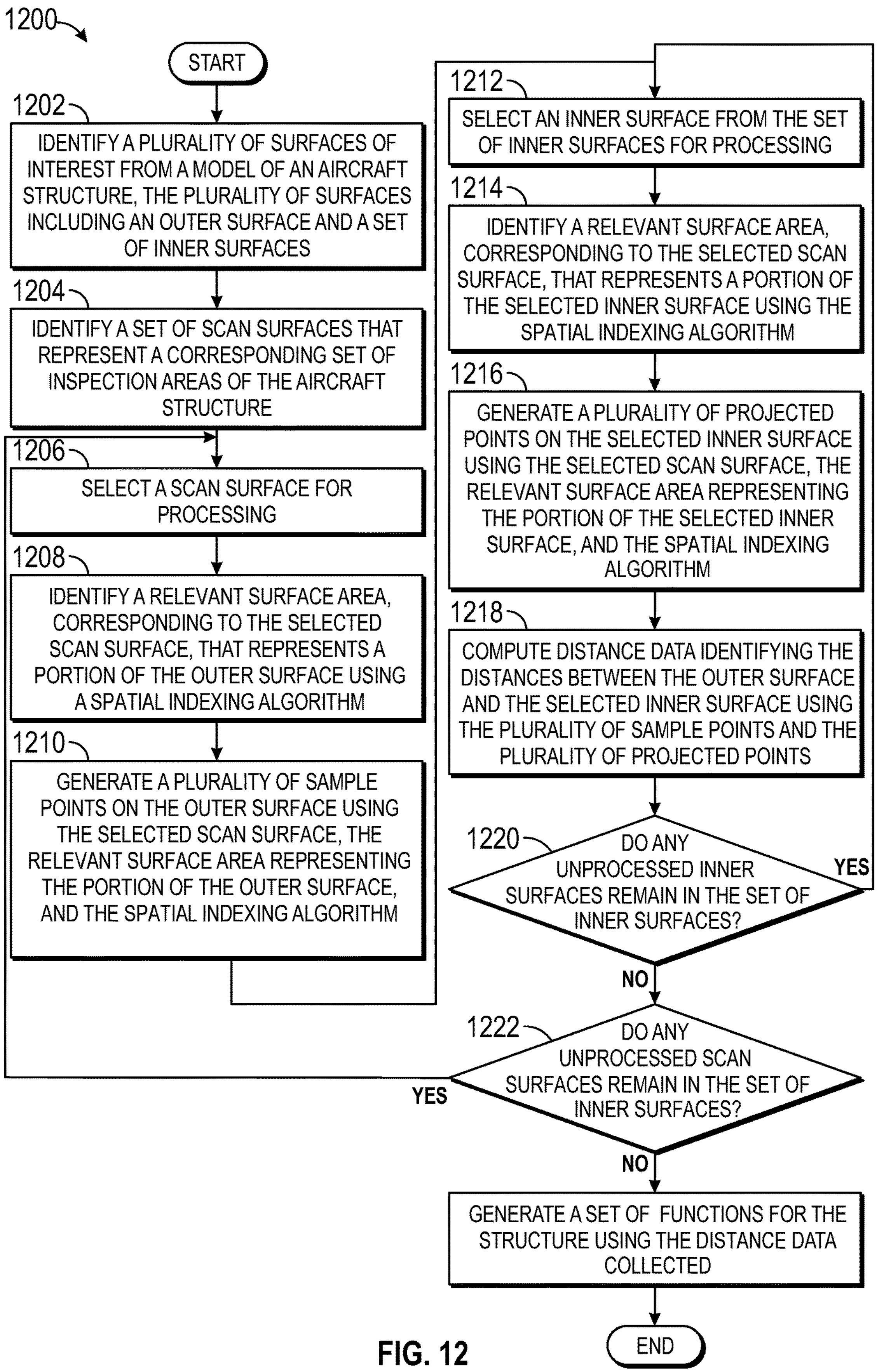
FIG. 12 is a flowchart of a process for generating a set of functions for a structure in accordance with one or more example embodiments.

FIG. 12 is a flowchart of a process for generating a set of functions for a structure in accordance with one or more example embodiments. Process 1200 in FIG. 12 may be implemented using inspection system 100 in FIG. 1. As one example, process 1200 may be implemented using analysis tool 104 in FIG. 1. While process 1200 is described with respect to an aircraft structure, process 1200 may also be used with respect to other types of structures.

Process 1200 may begin by identifying a plurality of surfaces of interest from a model of an aircraft structure, the plurality of surfaces including an outer surface and a set of inner surfaces (operation 1202). The aircraft structure may be a composite aircraft structure.

A set of scan surfaces that represent a corresponding set of inspection areas of the aircraft structure is identified (operation 1204). For example, the aircraft structure may be a large fuselage structure for which multiple inspection areas (or zones) have been identified. A scan surface is identified for each of these different inspection areas. In one or more examples, these inspection areas are non-overlapping. In other examples, two or more of the inspection areas may at least partially overlap.

A scan surface is selected for processing (operation 1206). A relevant surface area, corresponding to the selected scan surface, that represents a portion of the outer surface is identified using a spatial indexing algorithm (operation 1208). The relevant surface area may comprise a portion of patches selected from a geometric representation of the outer surface. The relevant surface area corresponds to the selected scan surface by including those patches that would at least completely overlap with the selected scan surface if the selected scan surface were superimposed over the outer surface. The spatial indexing algorithm described in process 1200 may be, for example, spatial indexing algorithm 124 in FIG. 1.

A plurality of sample points on the outer surface are generated using the selected scan surface, the relevant surface area representing the portion of the outer surface, and the spatial indexing algorithm (operation 1210).

An inner surface from the set of inner surfaces is selected for processing (operation 1212). A relevant surface area, corresponding to the selected scan surface, that represents a portion of the selected inner surface is identified using the spatial indexing algorithm (operation 1214). The relevant surface area may comprise a portion of patches selected from a geometric representation of the selected inner surface. The relevant surface area corresponds to the selected scan surface by including those patches that would at least completely overlap with the selected scan surface if the selected scan surface were superimposed over the selected inner surface.

A plurality of projected points on the selected inner surface are generated using the selected scan surface, the relevant surface area representing the portion of the selected inner surface, and the spatial indexing tree algorithm (operation 1216).

Distance data identifying the distance between the outer surface and the selected inner surface is computed using the plurality of sample points and the plurality of projected points (operation 1218). A determination is made as to whether any unprocessed inner surfaces remain in the set of inner surfaces (operation 1220). If any unprocessed inner surfaces remain, process 1200 returns to operation 1212 described above. Otherwise, a determination is made as to whether any unprocessed scan surfaces remain in the set of scan surfaces (operation 1222). If any unprocessed scan surfaces remain, process 1200 returns to operation 1206 described above.

Otherwise, the distance data collected is used to generate a set of functions for the structure (operation 1224). In one or more examples, each function of the set of functions may be a continuous function. In operation 1222, each function of the set of functions may correspond to a different inner surface of the set of inner surfaces. Each function may be used to identify an as-designed distance between the outer surface and the corresponding inner surface at any point along the outer surface.

With respect to operations 1208 and 1210, generating the relevant surface area representing the portion of the outer surface corresponding to each scan surface of the set of scan surfaces reduces the overall processing time and processing resources needed to generate the sample points for each scan surface. Similarly, with respect to operations 1214 and 1216, generating the relevant surface representing the portion of each inner surface of the set of inner surfaces corresponding to a selected scan surface reduces the overall processing time and processing resources needed to generate the projected points for each inner surface.

Figure 13:
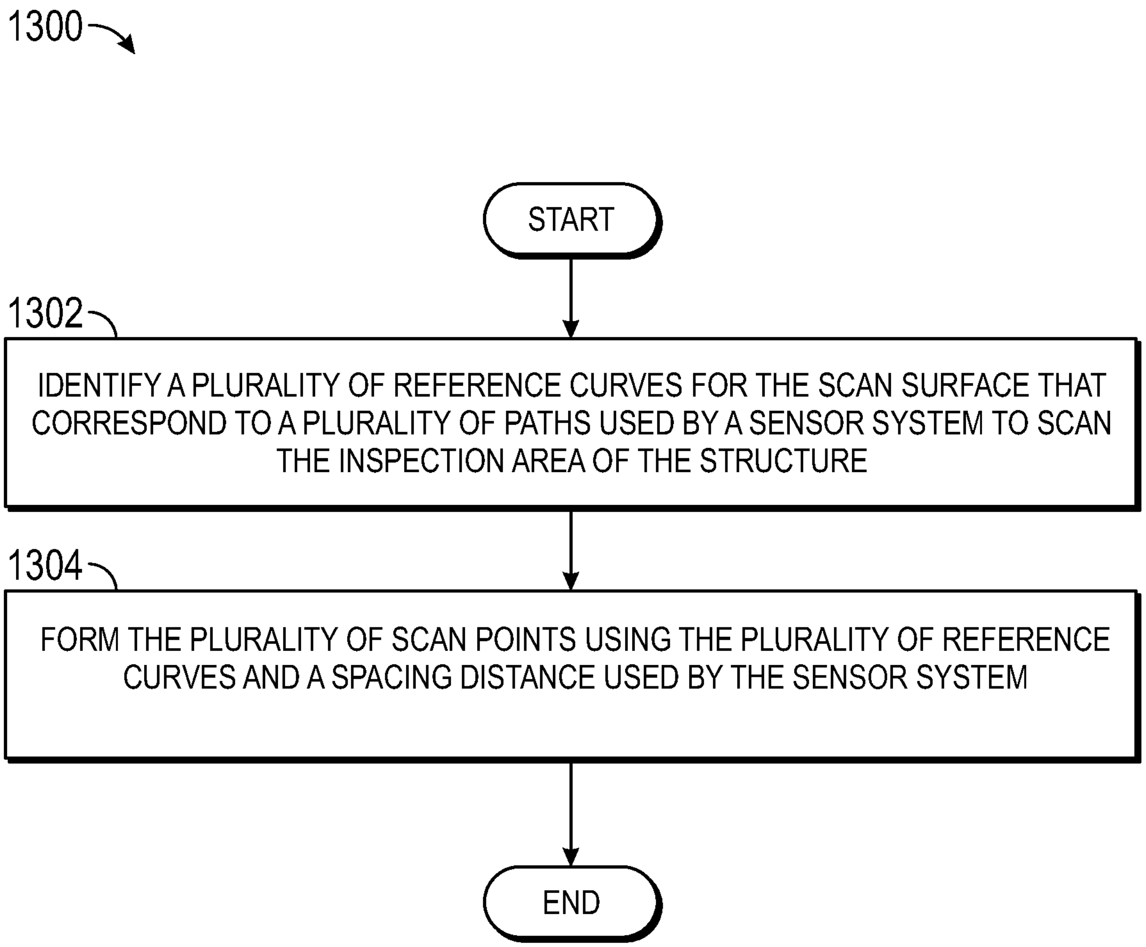
FIG. 13 is a flowchart of a process for identifying a plurality of scan points in accordance with one or more example embodiments.

FIG. 13 is a flowchart of a process for identifying a plurality of scan points in accordance with one or more example embodiments. Process 1300 in FIG. 13 may be implemented using analysis tool 104 in FIG. 1. Process 1300 may be one example of a manner in which operation 904 in FIG. 9 may be implemented.

Process 1300 may begin by identifying a plurality of reference curves for the scan surface that correspond to a plurality of paths used by a sensor system to scan the inspection area of the structure (operation 1302). In operation 1302, the plurality of reference curves may be identified based on a program that was used or is to be used to control the sensor system. In one or more examples, the reference curves are substantially parallel to each other and equally spaced apart. As used herein, "substantially parallel" means parallel or nearly parallel. The sensor system in operation 1302 may be, for example, sensor system 102 in FIG. 1.

Next, a plurality of scan points are formed using the plurality of reference curves and a spacing distance used by the sensor system (operation 1304), with the process terminating thereafter. The spacing distance provides the distance for scan points identified along a same reference curve.

Operation 1304 may be performed in various ways. In one or more examples, operation 1304 includes identifying points along each reference curve of the plurality of reference curves based on the spacing distance to form a collection of points. Operation 1304 may further include selecting a portion of the collection of points that falls within a boundary corresponding to the inspection area to form the plurality of scan points.

Figure 14:
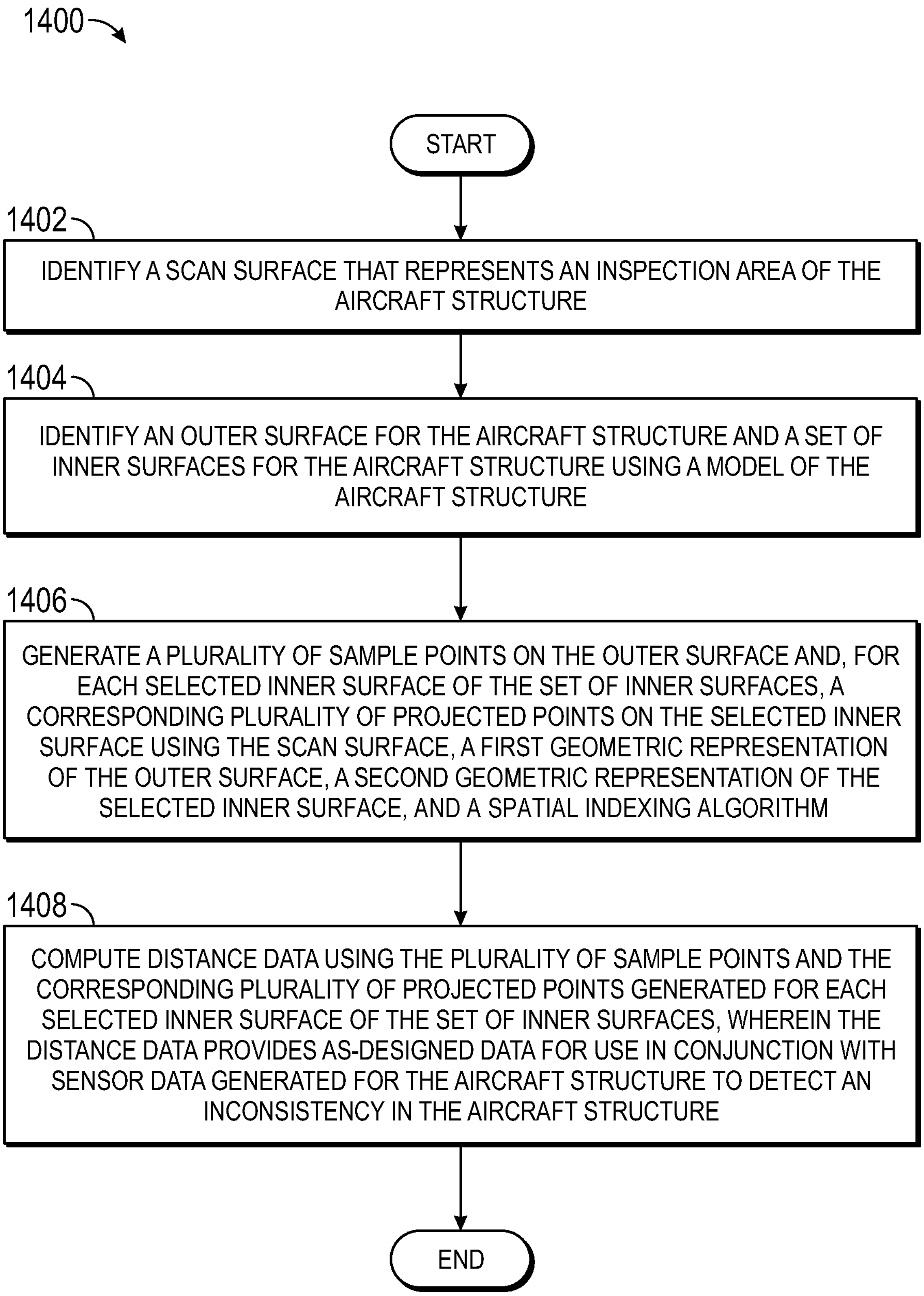
FIG. 14 is a flowchart of a process for computing distance data for an aircraft structure in accordance with one or more example embodiments.

FIG. 14 is a flowchart of a process for computing distance data for an aircraft structure in accordance with one or more example embodiments. Process 1400 in FIG. 14 may be implemented using analysis tool 104 in FIG. 1. While process 1400 is described with respect to an aircraft structure, process 1400 may also be used with respect to other types of structures, including various types of composite structures.

Process 1400 may begin by identifying a scan surface that represents an inspection area of the aircraft structure (operation 1402). An outer surface for the aircraft structure and a set of inner surfaces for the aircraft structure are identified using a model of the aircraft structure (operation 1404).

Thereafter, a plurality of sample points on the outer surface and, for each selected inner surface of the set of inner surfaces, a corresponding plurality of projected points on the selected inner surface are generated using the scan surface, a first geometric representation of the outer surface, a second geometric representation of the selected inner surface, and a spatial indexing algorithm (operation 1406). Using the spatial indexing algorithm may help speed up processing. In one or more examples, the spatial indexing algorithm uses one or more k-dimensional trees to provide indexing for the first geometric representation and the second geometric representation.

Distance data is computed using the plurality of sample points and the corresponding plurality of projected points generated for each selected inner surface of the set of inner surfaces, wherein the distance data provides as-designed data for use in conjunction with sensor data generated for the aircraft structure to detect an inconsistency in the aircraft structure (operation 1408), with the process terminating thereafter. In some examples, operation 1408 includes generating a function (e.g., a continuous function) for each pairing of the outer surface and an inner surface of the set of inner surfaces.

This function, which may be, for example, function 126 in FIG. 1, may be used to quickly and reliably identify the as-designed distance between the outer surface and the particular inner surface for any location on the outer surface. This as-designed distance may be compared to measurements generated by a sensor system for the actual aircraft structure to evaluate whether the aircraft structure conforms with the design for the aircraft structure. Differences between the as-designed distances and the measurements generated by the sensor system that are outside of selected tolerances may indicate the presence of an inconsistency in the aircraft structure. The inconsistency may include a void, delamination, a crack, an undesired level of porosity, some other type of inconsistency, or a combination thereof.

Figure 15:
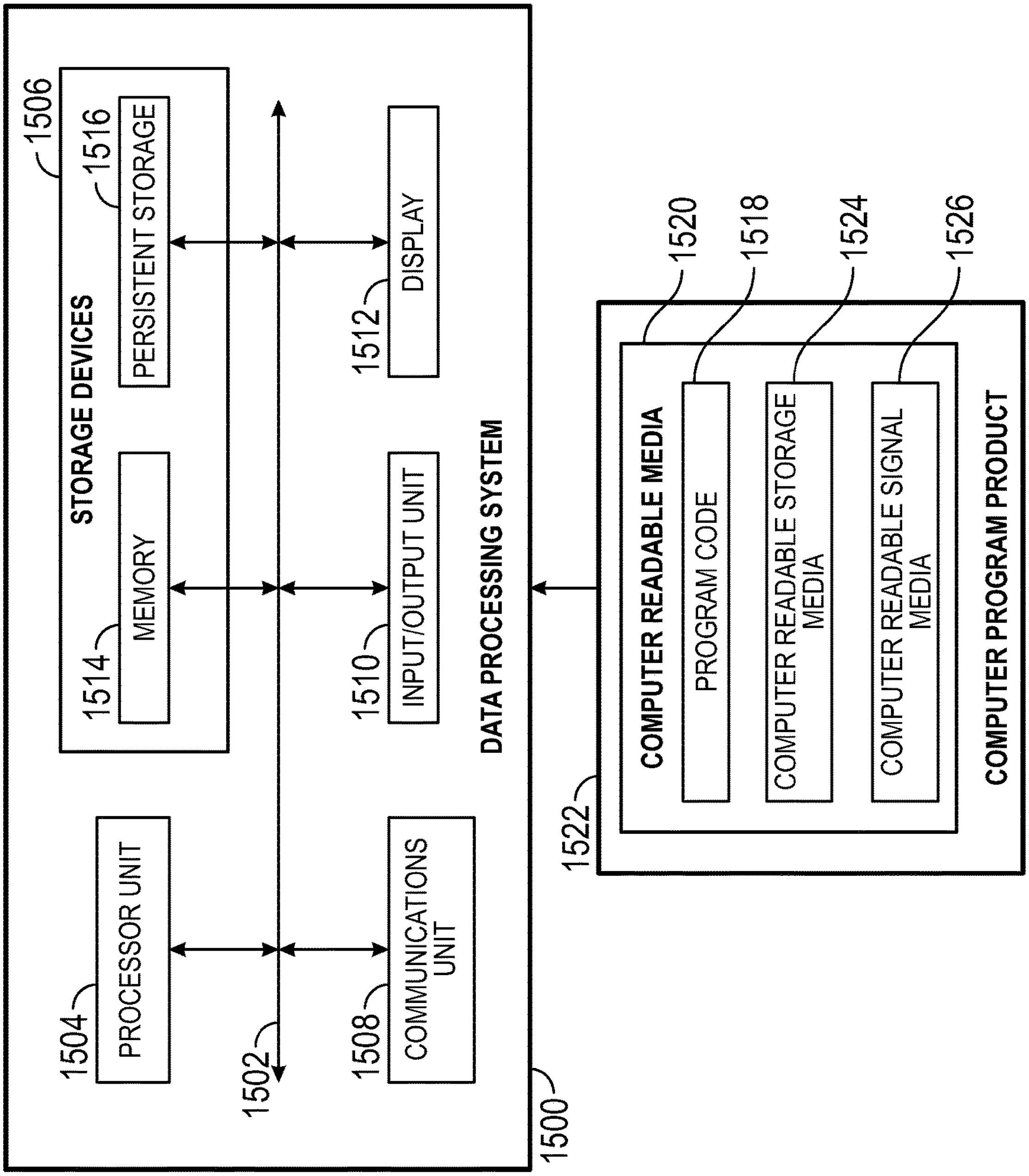
FIG. 15 is a block diagram of a data processing system in accordance with an example embodiment.

Turning now to FIG. 15, an illustration of a data processing system in the form of a block diagram is depicted in accordance with an example embodiment. Data processing system 1500 may be used to implement computer system 108 in FIG. 1. As depicted, data processing system 1500 includes communications framework 1502, which provides communications between processor unit 1504, storage devices 1506, communications unit 1508, input/output unit 1510, and display 1512. In some cases, communications framework 1502 may be implemented as a bus system.

Processor unit 1504 is configured to execute instructions for software to perform a number of operations. Processor unit 1504 may comprise a number of processors, a multi-processor core, and/or some other type of processor, depending on the implementation. In some cases, processor unit 1504 may take the form of a hardware unit, such as a circuit system, an application specific integrated circuit (ASIC), a programmable logic device, or some other suitable type of hardware unit.

Instructions for the operating system, applications, and/or programs run by processor unit 1504 may be located in storage devices 1506. Storage devices 1506 may be in communication with processor unit 1504 through communications framework 1502. As used herein, a storage device, also referred to as a computer readable storage device, is any piece of hardware capable of storing information on a temporary and/or permanent basis. This information may include, but is not limited to, data, program code, and/or other information.

Memory 1514 and persistent storage 1516 are examples of storage devices 1506. Memory 1514 may take the form of, for example, a random access memory or some type of volatile or non-volatile storage device. Persistent storage 1516 may comprise any number of components or devices. For example, persistent storage 1516 may comprise a hard drive, a flash memory, a rewritable optical disk, a rewritable magnetic tape, or some combination of the above. The media used by persistent storage 1516 may or may not be removable.

Communications unit 1508 allows data processing system 1500 to communicate with other data processing systems and/or devices. Communications unit 1508 may provide communications using physical and/or wireless communications links.

Input/output unit 1510 allows input to be received from and output to be sent to other devices connected to data processing system 1500. For example, input/output unit 1510 may allow user input to be received through a keyboard, a mouse, and/or some other type of input device. As another example, input/output unit 1510 may allow output to be sent to a printer connected to data processing system 1500.

Display 1512 is configured to display information to a user. Display 1512 may comprise, for example, without limitation, a monitor, a touch screen, a laser display, a holographic display, a virtual display device, and/or some other type of display device.

In one or more examples, the processes of the different example embodiments may be performed by processor unit 1504 using computer-implemented instructions. These instructions may be referred to as program code, computer usable program code, or computer readable program code and may be read and executed by one or more processors in processor unit 1504.

In these examples, program code 1518 is located in a functional form on computer readable media 1520, which is selectively removable, and may be loaded onto or transferred to data processing system 1500 for execution by processor unit 1504. Program code 1518 and computer readable media 1520 together form computer program product 1522. In one or more examples, computer readable media 1520 may be computer readable storage media 1524 or computer readable signal media 1526.

Computer readable storage media 1524 is a physical or tangible storage device used to store program code 1518 rather than a medium that propagates or transmits program code 1518. Computer readable storage media 1524 may be, for example, without limitation, an optical or magnetic disk or a persistent storage device that is connected to data processing system 1500.

Alternatively, program code 1518 may be transferred to data processing system 1500 using computer readable signal media 1526. Computer readable signal media 1526 may be, for example, a propagated data signal containing program code 1518. This data signal may be an electromagnetic signal, an optical signal, and/or some other type of signal that can be transmitted over physical and/or wireless communications links.

The illustration of data processing system 1500 in FIG. 15 is not meant to provide architectural limitations to the manner in which the example embodiments may be implemented. The different example embodiments may be implemented in a data processing system that includes components in addition to or in place of those illustrated for data processing system 1500. Further, components shown in FIG. 15 may be varied from the examples shown.

Figure 16:
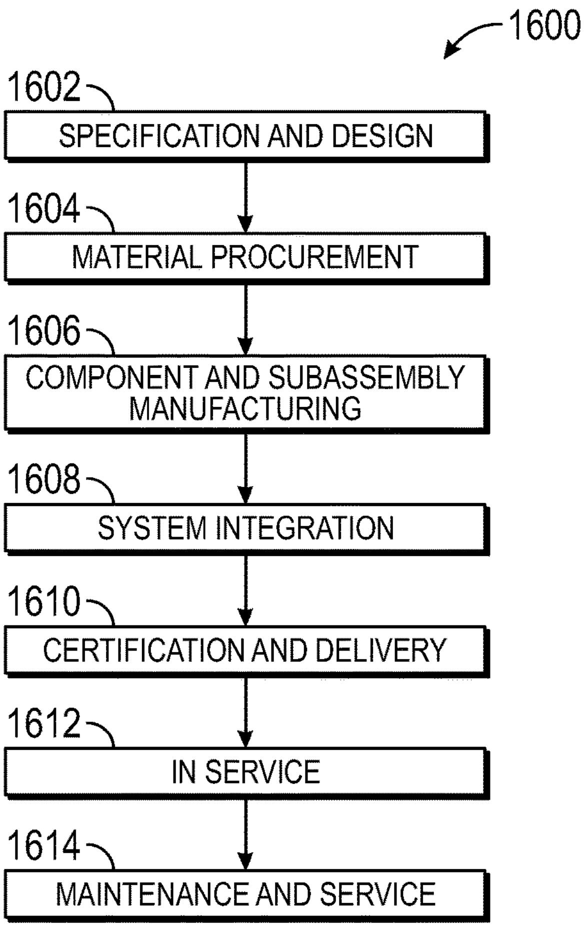
FIG. 16 is an illustration of an aircraft manufacturing and service method in accordance with an example embodiment.
Figure 17:
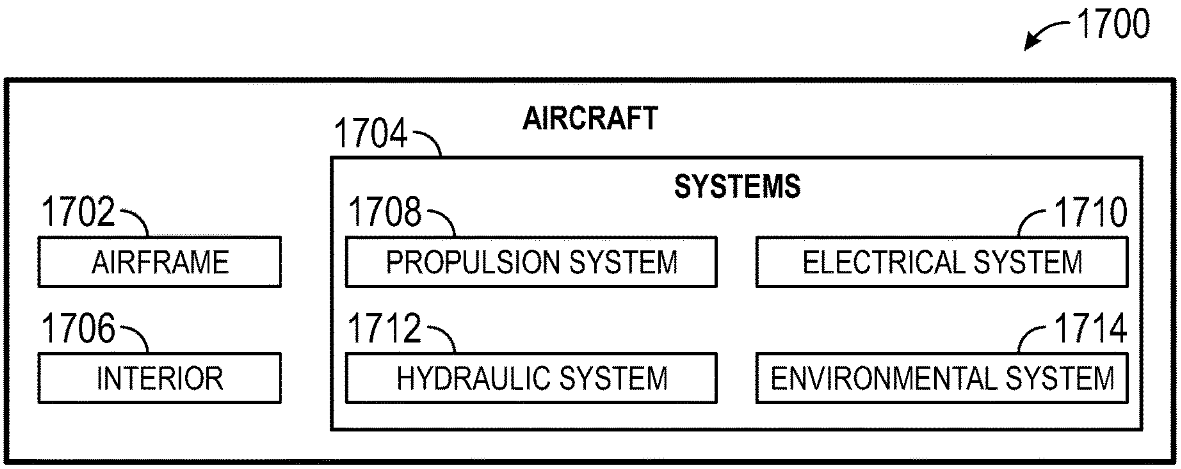
FIG. 17 is a block diagram of an aircraft in accordance with an example embodiment.

Example embodiments of the disclosure may be described in the context of aircraft manufacturing and service method 1600 as shown in FIG. 16 and aircraft 1700 as shown in FIG. 17. Turning first to FIG. 16, an illustration of an aircraft manufacturing and service method is depicted in accordance with an example embodiment. During pre-production, aircraft manufacturing and service method 1600 may include specification and design 1602 of aircraft 1700 in FIG. 17 and material procurement 1604.

During production, component and subassembly manufacturing 1606 and system integration 1608 of aircraft 1700 in FIG. 17 takes place. Thereafter, aircraft 1700 in FIG. 17 may go through certification and delivery 1610 in order to be placed in service 1612. While in service 1612 by a customer, aircraft 1700 in FIG. 17 is scheduled for routine maintenance and service 1614, which may include modification, reconfiguration, refurbishment, and other maintenance or service.

Each of the processes of aircraft manufacturing and service method 1600 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 17, an illustration of an aircraft is depicted in which an example embodiment may be implemented. In this example, aircraft 1700 is produced by aircraft manufacturing and service method 1600 in FIG. 16 and may include airframe 1702 with plurality of systems 1704 and interior 1706. Examples of systems 1704 include one or more of propulsion system 1708, electrical system 1710, hydraulic system 1712, and environmental system 1714. Any number of other systems may be included. Although an aerospace example is shown, different example embodiments may be applied to other industries, such as the automotive industry.

Apparatuses and methods embodied herein may be employed during at least one of the stages of aircraft manufacturing and service method 1600 in FIG. 16. In particular, fabrication system 164 from FIG. 1 may be used to fabricate tool 162 during any one of the stages of aircraft manufacturing and service method 1600. For example, without limitation, inspection system 100, sensor system 102, or analysis tool 104 from FIG. 1 may be used during at least one of component and subassembly manufacturing 1606, system integration 1608, certification and delivery 1610, routine maintenance and service 1614, or some other stage of aircraft manufacturing and service method 1600. Still further, inspection system 100 may be used to inspect one or more aircraft structures of aircraft 1700 such as, but not limited to, one or more structures of airframe 1702, interior 1706, or both of aircraft 1700 in FIG. 17. Analysis tool 104 in FIG. 1 may be used to compute distance data 110 for these aircraft structures of aircraft 1700.

In one or more example, components or subassemblies produced in component and subassembly manufacturing 1606 in FIG. 16 may be fabricated or manufactured in a manner similar to components or subassemblies produced while aircraft 1700 is in service 1612 in FIG. 16. As yet another example, one or more apparatus embodiments, method embodiments, or a combination thereof may be utilized during production stages, such as component and subassembly manufacturing 1606 and system integration 1608 in FIG. 16. One or more apparatus embodiments, method embodiments, or a combination thereof may be utilized while aircraft 1700 is in service 1612 and/or during maintenance and service 1614 in FIG. 16. The use of a number of the different example embodiments may substantially expedite the assembly of and/or reduce the cost of aircraft 1700. Further, one or more embodiments described herein may be used as part of propulsion system 1708 of aircraft 1700.

The flowcharts and block diagrams in the different depicted embodiments illustrate the architecture, functionality, and operation of some possible implementations of apparatuses and methods in an example embodiment. In this regard, each block in the flowcharts or block diagrams may represent a module, a segment, a function, and/or a portion of an operation or step.

In some alternative implementations of an example embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

As used herein, the phrase "at least one of," when used with a list of items, means different combinations of one or more of the listed items may be used and only one of the items in the list may be needed. The item may be a particular object, thing, step, operation, process, or category. In other words, "at least one of" means any combination of items or number of items may be used from the list, but not all of the items in the list may be required. For example, without limitation, "at least one of item A, item B, or item C" or "at least one of item A, item B, and item C" may mean item A; item A and item B; item B; item A, item B, and item C; item B and item C; or item A and C. In some cases, "at least one of item A, item B, or item C" or "at least one of item A, item B, and item C" may mean, but is not limited to, two of item A, one of item B, and ten of item C; four of item B and seven of item C; or some other suitable combination.

The description of the different example embodiments has been presented for purposes of illustration and description, and is not intended to be exhaustive or limited to the embodiments in the form disclosed. Many modifications and variations will be apparent to those of ordinary skill in the art. Further, different example embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method comprising:

identifying, by a device, a scan surface that represents an inspection area of a fuselage structure, wherein the scan surface is formed using a convex shape;

generating, by the device, a plurality of sample points on an outer surface of the fuselage structure identified from a model of the fuselage structure and a corresponding plurality of projected points on an inner surface of the fuselage structure identified from the model of the fuselage structure using the scan surface, a first geometric representation of the outer surface, and a second geometric representation of the inner surface, wherein the outer surface is an outer mold line (OML) of the fuselage structure, and wherein generating the plurality of sample points on the outer surface further comprises:

identifying a plurality of scan points on the convex shape, processing, for each selected scan point of the plurality of scan points on the convex shape, a relevant surface area to identify a patch of the relevant surface area that is nearest the selected scan point, wherein the patch is a portion or section of the first geometric representation or of the second geometric representation, and forming, for each selected scan point, a sample point of the plurality of sample points based on using a point on the patch, the scan surface, and a location of the selected scan point, and wherein the corresponding plurality of projected points on the inner surface is a point that is projected from a corresponding one of sample points along a vector that is normal with selected tolerances to the outer surface and that lies on or is coincident with the inner surface;

computing, by the device, distance data using the plurality of sample points and the corresponding plurality of projected points;

generating, by the device, a three dimensional distance map that visually presents at least a portion of the distance data; and analyzing, by the device, the three dimensional distance map to detect a presence of an inconsistency in the fuselage structure.

2. The method of claim 1, wherein the three dimensional distance map includes a color-coded thickness map that represents at least a portion of the distance data.

3. The method of claim 1, further comprising:

generating a function using the distance data that enables a distance between the outer surface and the inner surface to be computed via the function at any selected point along the outer surface.

4. The method of claim 1, wherein identifying the scan surface comprises:

identifying coordinates for the inspection area of the fuselage structure;

creating an initial surface of the fuselage structure using the coordinates; and forming the scan surface using the convex shape such that the scan surface has the convex shape.

5. The method of claim 1, wherein generating the plurality of sample points on the outer surface comprises:

identifying an outer relevant surface area of the fuselage structure that represents a portion of the outer surface corresponding to the scan surface.

6. The method of claim 1, wherein identifying the plurality of scan points comprises:

identifying a plurality of reference curves for the scan surface corresponding to a plurality of paths used by a sensor system to scan the inspection area of the fuselage structure; and forming the plurality of scan points using the plurality of reference curves and a spacing distance used by the sensor system.

7. The method of claim 6, wherein forming the plurality of scan points comprises:

identifying points along each reference curve of the plurality of reference curves based on the spacing distance to form a collection of points; and selecting a portion of the collection of points that falls within a boundary corresponding to the inspection area to form the plurality of scan points.

8. The method of claim 5, wherein identifying the outer relevant surface area of the fuselage structure comprises:

generating the first geometric representation of the outer surface, the first geometric representation comprising a plurality of patches;

sampling the first geometric representation to generate sampling points;

narrowing the sampling points to a focused collection of sampling points using a spatial indexing algorithm; and forming the outer relevant surface area of the fuselage structure based on the focused collection of sampling points, the relevant surface area of the fuselage structure comprising a selected portion of the plurality of patches.

9. The method of claim 1, wherein generating the corresponding plurality of projected points on the inner surface comprises:

identifying an inner relevant surface area that represents a portion of the inner surface corresponding to the scan surface.

10. The method of claim 9, wherein generating the corresponding plurality of projected points on the inner surface further comprises:

processing, for each selected sample point of the plurality of sample points, the inner relevant surface area to identify a patch of the relevant surface area that is nearest the selected sample point; and forming, for each selected sample point of the plurality of sample points, a projected point using a point on the patch that intersects with a vector that is substantially normal with selected tolerances to the outer surface at a location of the selected sample point.

11. The method of claim 9, wherein identifying the inner relevant surface area comprises:

generating the second geometric representation of the inner surface, the second geometric representation comprising a plurality of patches;

sampling the second geometric representation to generate sampling points;

narrowing the sampling points to a focused collection of sampling points using a spatial indexing algorithm; and forming the inner relevant surface area based on the focused collection of sampling points, the inner relevant surface area comprising a selected portion of the plurality of patches.

12. The method of claim 1, wherein the plurality of sampling points and the corresponding plurality of projected points form a plurality of point pairs and wherein computing the distance data comprises:

computing a distance between each point pair of the plurality of point pairs.

13. The method of claim 1, further comprising:

sending the three dimensional distance map to a display device for display to a user.

14. The method of claim 1, wherein the three dimensional distance map visually presents thicknesses of the fuselage structure.

15. A system comprising:

a memory; and a processor coupled to the memory and to cause the processor to implement an analysis tool configured to:

identify a scan surface that represents an inspection area of a fuselage structure, wherein the scan surface is formed using a convex shape;

generate a plurality of sample points on an outer surface of the fuselage structure identified from a model of the fuselage structure and a corresponding plurality of projected points on an inner surface identified from the model of the fuselage structure using the scan surface, a first geometric representation of the outer surface, and a second geometric representation of the inner surface, wherein the outer surface is an outer mold line (OML) of the fuselage structure, and wherein the analysis tool, to generate the plurality of sample points on the outer surface, are to:

identify a plurality of scan points on the convex shape of the scan surface, process, for each selected scan point of the plurality of scan points on the convex shape, a relevant surface area to identify a patch of the relevant surface area that is nearest the selected scan point, wherein the patch is a portion or section of the first geometric representation or the second geometric representation, and form, for each selected scan point, a sample point of the plurality of sample points based on using a point on the patch, the scan surface and a location of the selected scan point, and wherein the corresponding plurality of projected points on the inner surface is a point that is projected from a corresponding one of sample points along a vector that is normal with selected tolerances to the outer surface and that lies on or is coincident with the inner surface;

compute distance data using the plurality of sample points and the corresponding plurality of projected points, wherein the distance data identifies a distance between a point pair formed by a sample point of the plurality of sample points and a projected point of the corresponding plurality of projected points;

generate a three dimensional distance map that visually presents at least a portion of the distance data; and analyze the three dimensional distance map to detect a presence of an inconsistency in the fuselage structure.

16. The system of claim 15, wherein the three dimension distance map includes a thickness map.

17. The system of claim 15, wherein the analysis tool is further configured to generate a function using the distance data that enables a distance between the outer surface and the inner surface to be computed via the function at any selected point along the outer surface.

18. The system of claim 15, wherein the three dimensional distance map includes a color-coded thickness map that represents at least a portion of the distance data.

19. The system of claim 15, wherein the inconsistency includes one or more of:

a void, a delamination, a crack, or a certain level of porosity.

20. A non-transitory computer-readable medium storing instructions, the instructions comprising:

one or more instructions that, when executed by one or more processors, cause the one or more processors of a first node to:

identify a scan surface that represents an inspection area of a fuselage structure, wherein the scan surface is formed using a convex shape;

generate a plurality of sample points on an outer surface of the fuselage structure identified from a model of the fuselage structure and a corresponding plurality of projected points on an inner surface identified from the model of the fuselage structure using the scan surface, a first geometric representation of the outer surface, and a second geometric representation of the inner surface, wherein the outer surface is an outer mold line (OML) of the fuselage structure, and wherein the one or more instructions, cause the one or more processors to generate the plurality of sample points on the inner surface, further cause the one or more processors to:

identify a plurality of scan points on the convex shape of the scan surface;

process, for each selected scan point of the plurality of scan points on the convex shape, a relevant surface area to identify a patch of the relevant surface area that is nearest the selected scan point, wherein the patch is a portion or section of the first geometric representation or the second geometric representation, and form, for each selected scan point, a sample point of the plurality of sample points based on using a point on the patch, the scan surface and a location of the selected scan point, and wherein the corresponding plurality of projected points on the inner surface is a point that is projected from a corresponding one of sample points along a vector that is normal with selected tolerances to the outer surface and that lies on or is coincident with the inner surface;

compute distance data using the plurality of sample points and the corresponding plurality of projected points, wherein the distance data identifies a distance between a point pair formed by a sample point of the plurality of sample points and a projected point of the corresponding plurality of projected points;

generate a three dimensional distance map that visually presents at least a portion of the distance data; and analyze the three dimensional distance map to detect a presence of an inconsistency in the fuselage structure.

* * * * *